(12) United States Patent
Ito

(10) Patent No.: US 8,955,946 B2
(45) Date of Patent: Feb. 17, 2015

(54) LIQUID DISCHARGE APPARATUS, PIEZOELECTRIC ACTUATOR, AND METHOD FOR PRODUCING LIQUID DISCHARGE APPARATUS

(71) Applicant: Atsushi Ito, Nagoya (JP)

(72) Inventor: Atsushi Ito, Nagoya (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/187,738

(22) Filed: Feb. 24, 2014

(65) Prior Publication Data
US 2014/0292935 A1   Oct. 2, 2014

(30) Foreign Application Priority Data

Mar. 26, 2013  (JP) ................................ 2013-064464

(51) Int. Cl.
| | |
|---|---|
| *B41J 2/14* | (2006.01) |
| *B41J 2/16* | (2006.01) |
| *B41J 2/045* | (2006.01) |
| *H01L 41/09* | (2006.01) |

(52) U.S. Cl.
CPC ............. *B41J 2/14201* (2013.01); *H01L 41/09* (2013.01); *B41J 2/1607* (2013.01)
USPC ............................................. 347/50; 347/68

(58) Field of Classification Search
CPC ................... B41J 2002/14491; B41J 2/14072; B41J 2/14233; B41J 2/1623; B41J 2/14; B41J 2/14201; B41J 2/161; B41J 2/045
See application file for complete search history.

(56) References Cited

U.S. PATENT DOCUMENTS

2009/0225138 A1 * 9/2009 Watanabe ....................... 347/70

FOREIGN PATENT DOCUMENTS

JP    2012-218314    11/2012

* cited by examiner

*Primary Examiner* — Lisa M Solomon
(74) *Attorney, Agent, or Firm* — Frommer Lawrence & Haug LLP

(57) ABSTRACT

A liquid discharge apparatus includes a flow passage structure in which a liquid flow passage including a nozzle for discharging a liquid and a pressure chamber communicated with the nozzle, and a liquid sealing layer for covering the pressure chamber are formed; and a piezoelectric actuator which is arranged to contact with the liquid sealing layer of the flow passage structure. The piezoelectric actuator includes: an actuator substrate, which is arranged on a surface of the liquid sealing layer on a side opposite to the pressure chamber and which has a vibration layer and a columnar portion arranged between the liquid sealing layer and the vibration layer; and a piezoelectric portion which is formed as a film on a surface of the vibration layer disposed on a side opposite to the columnar portion.

18 Claims, 18 Drawing Sheets

LIQUID DISCHARGE APPARATUS, PIEZOELECTRIC ACTUATOR, AND METHOD FOR PRODUCING LIQUID DISCHARGE APPARATUS

CROSS REFERENCE TO RELATED APPLICATION

The present application claims priority from Japanese Patent Application No. 2013-064464, filed on Mar. 26, 2013, the disclosure of which is incorporated herein by reference in its entirety.

BACKGROUND OF THE INVENTION

1. Field of the Invention

The present invention relates to a liquid discharge apparatus, a piezoelectric actuator, and a method for producing the liquid discharge apparatus.

2. Description of the Related Art

Japanese Patent Application Laid-open No. 2012-218314 discloses a liquid discharge apparatus formed by using a silicon single crystal substrate. The liquid discharge apparatus of Japanese Patent Application Laid-open No. 2012-218314 has a first substrate and a second substrate which are formed of silicon and a nozzle plate. The first substrate is formed with a liquid flow passage including a plurality of pressure chambers. A plurality of piezoelectric elements, which correspond to the plurality of pressure chambers, are provided on a vibration plate of the first substrate for covering the plurality of pressure chambers. The second substrate is joined to the vibration plate of the first substrate so that the plurality of piezoelectric elements are covered therewith. The nozzle plate is joined to the surface of the first substrate on the side opposite to the second substrate.

The liquid discharge apparatus of Japanese Patent Application Laid-open No. 2012-218314 is produced by performing the following steps (1) to (5).

(1) An oxidation treatment is applied to the surface of the first substrate of silicon to form the vibration plate of silicon oxide.

(2) Various type of film formation steps and patterning steps are repeatedly performed for the vibration plate to form piezoelectric elements and electrodes.

(3) The second substrate of silicon is joined to the vibration plate of the first substrate.

(4) The first substrate is polished and thinned until a predetermined thickness is obtained.

(5) Etching is performed from the surface of the first substrate on the side opposite to the vibration plate, and thus the liquid flow passage including the plurality of pressure chambers is formed for the first substrate.

SUMMARY OF THE INVENTION

In the production steps of producing the liquid discharge apparatus described in Japanese Patent Application Laid-open No. 2012-218314, the plurality of piezoelectric elements are formed by means of a so-called semiconductor process on the first substrate of single crystal silicon in the step of (2). In accordance with this method, the respective piezoelectric elements can be formed at a high accuracy, and a large number of the piezoelectric elements can be arranged at a high degree of integration on the first substrate. However, a problem arises such that the production cost is expensive, because the two silicon substrates are used.

In relation to this viewpoint, it is conceived that the first substrate of silicon for preparing the plurality of piezoelectric elements is essential, but the second substrate is omitted, or the second substrate is formed of any material other than silicon. In this case, the step of (3) described above, in which the second substrate is joined in the course of the production process for the first substrate, disappears. Therefore, the steps to be performed thereafter should be carried out by using only the first substrate. However, if only the first substrate is used, the handling becomes difficult in the following steps in some cases.

In particular, it is necessary that the first substrate should be polished and thinned in the step of (4), in general, the silicon wafer, which is the base of the first substrate, has a thickness of several hundreds of μm. However, it is necessary that the thickness of the first substrate should be thinned by means of the polishing processing until arrival at a thickness of several tens of μm corresponding to the flow passage shape before the flow passage of the pressure chamber or the like, which affects the liquid discharge characteristic, is formed for the first substrate by means of the etching. However, it is difficult to stably perform the polishing step in a state in which the second substrate is not joined and only the first substrate is present. Further, it is also difficult that the first substrate, which is thinned by the step of (4), is subjected to the handling in the following steps such as the etching step of (5) or the like.

An object of the present invention is to decrease the number of silicon substrates to be used and make it easy to perform the handling of the substrate in production steps.

According to a first aspect of the present invention, there is provided a liquid discharge apparatus including: a flow passage structure in which a liquid flow passage including a nozzle for discharging a liquid and a pressure chamber communicated with the nozzle, and a liquid sealing layer for covering the pressure chamber are formed; and a piezoelectric actuator which is arranged to contact with the liquid sealing layer of the flow passage structure, wherein the piezoelectric actuator has: an actuator substrate which is arranged on a surface of the liquid sealing layer on a side opposite to the pressure chamber, the actuator substrate having a vibration layer which is provided on a side of the actuator substrate opposite to the liquid sealing layer and which is opposed to the liquid sealing layer, and a columnar portion which is arranged to be opposed to the pressure chamber between the liquid sealing layer and the vibration layer and which is connected to the vibration layer; and a piezoelectric portion which is formed as a film on a surface of the vibration layer on a side opposite to the columnar portion.

In the first aspect of the present invention, the piezoelectric actuator is provided with the actuator substrate and the piezoelectric portion. The actuator substrate is provided with the vibration layer which is opposed to the liquid sealing layer and the columnar portion which is connected to the vibration layer. When the deformation arises in the vibration layer when the piezoelectric portion is driven, then the deformation of the vibration layer is transmitted to the liquid sealing layer by the aid of the columnar portion, and the pressure is applied to the liquid contained in the pressure chamber.

As described above, the columnar portion of the actuator substrate of the present invention is provided to transmit the deformation of the vibration layer to the liquid sealing layer. Therefore, it is not necessarily indispensable that the length of the columnar portion should be shortened. Therefore, it is unnecessary that the thickness of the actuator substrate is decreased to be not more than a certain value. It is unnecessary that the actuator substrate is processed to be thin by means of, for example, the polishing. Therefore, it is easy to perform the handling of the actuator substrate in the steps of producing the piezoelectric actuator. Further, it is unnecessary to join, for example, any other substrate of silicon in order to improve the handling performance of the actuator substrate, it is possible to decrease the number of wafers to be used. Further, the wafer can be used as the actuator substrate as well, while the wafer is hardly polished. Therefore, the polishing step can be omitted or simplified, and it is possible to reduce the production cost.

In the liquid discharge apparatus according to the first aspect of the present invention, the columnar portion intervenes between the piezoelectric portion and the pressure chamber of the flow passage structure, and thus the piezoelectric portion is separated from the pressure chamber in this arrangement. Therefore, any water content, which permeates through the liquid sealing layer from the pressure chamber, hardly arrives at the piezoelectric portion. The occurrence of, for example, the short circuit between electrodes provided for the piezoelectric portion and the migration is suppressed.

According to a second aspect of the present invention, there is provided a piezoelectric actuator including: an actuator substrate which has a vibration layer and a columnar portion connected to the vibration layer; and a piezoelectric portion which is arranged on a surface of the vibration layer on a side opposite to the columnar portion.

Also in the piezoelectric actuator according to the second aspect of the present invention, it is not necessarily indispensable that the length of the columnar portion should be shortened, in the same manner as in the liquid discharge apparatus according to the first aspect. Therefore, it is unnecessary that the thickness of the actuator substrate is decreased to be not more than a certain value. Therefore, it is easy to perform the handling of the actuator substrate in the steps of producing the piezoelectric actuator. Further, it is unnecessary to join any other substrate to the actuator substrate beforehand in order to improve the handling performance. Therefore, it is possible to decrease the number of wafers to be used.

As the method for producing the liquid discharge apparatus according to a third aspect of the present invention, there is provided a method for producing the liquid discharge apparatus according to the first aspect; including: a flow passage structure producing step tier producing the flow passage structure; an actuator producing step for producing the piezoelectric actuator; and a joining step for joining the flow passage structure and the piezoelectric actuator, wherein the actuator producing step includes: a piezoelectric portion forming step for forming the piezoelectric portion as a film on a surface of the vibration layer of the actuator substrate; and an etching step for forming, in the actuator substrate, the columnar portion and a recessed hole surrounding the columnar portion by performing etching from a surface of the actuator substrate on a side opposite to the vibration layer.

As described above, in consideration of the role of the columnar portion, it is unnecessary to especially thin the thickness of the actuator substrate. Therefore, the handling of the actuator substrate is easy in the respective steps of the actuator producing step. It is unnecessary to join any other silicon substrate to the actuator substrate beforehand.

DESCRIPTION OF THE PREFERRED EMBODIMENTS

Figure 1:
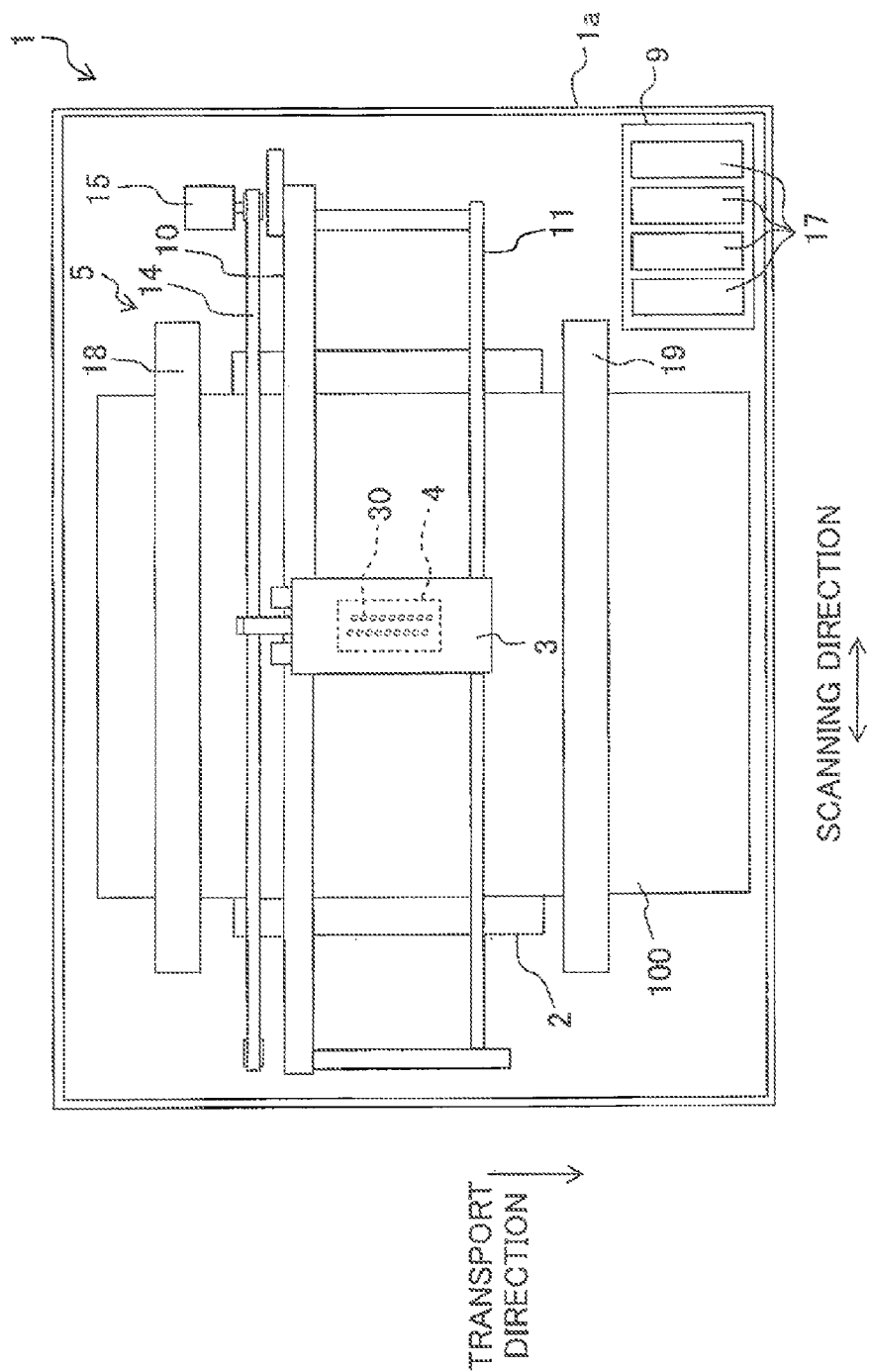
FIG. 1 shows a schematic plan view illustrating an ink-et printer according to an embodiment of the present invention.

Next, an embodiment of the present invention will be explained. This embodiment is an example in which the present invention is applied to an ink-jet printer. At first, an explanation will be made with reference to FIG. 1 about a schematic arrangement of the inkjet printer 1. In the following description, the front side with respect to the paper surface of FIG. 1 is defined as "upward direction", and the back side with respect to the paper surface is defined as "downward direction". An explanation will be made by appropriately using the terms of the directions of "upward" and "downward". As shown in FIG. 1, the inkjet printer 1 is provided with, for example, a platen 2, a carriage 3, an inkjet head 4, and a transport mechanism 5.

Recording paper 100 as a recording medium is placed on the upper surface of the platen 2. The carriage 3 is constructed reciprocatively movably in the scanning direction along two guide rails 10, 11 in an area opposed to the platen 2. An endless belt 14 is connected to the carriage 3. The endless belt 14 is driven by a carriage driving motor 15, and thus the carriage 3 is moved in the scanning direction.

The ink-jet head 4 is attached to the carriage 3, and the ink-jet head 4 is movable in the scanning direction together with the carriage 3. A main printer body 1a of the printer 1 is provided with a holder 9 to which a plurality of ink cartridges 17 are removably installed. The carriage 3 is connected to the holder 9 by means of unillustrated tubes. Inks contained in the ink cartridges 17 are supplied via the tubes to the inkjet head 4. A plurality of nozzles 30 are formed on the lower surface of the ink-jet head 4. The ink-jet head 4 is operated such that the inks, which are supplied from the ink cartridges 17, are discharged from the plurality of nozzles 30 to the recording paper 100 placed on the platen 2.

The transport mechanism 5 has two transport rollers 18, 19 which are arranged to interpose the platen 2 in the transport direction. The transport mechanism 5 transports, in the transport direction, the recording paper 100 placed on the platen 2, by means of the two transport rollers 18, 19.

The ink-jet printer 1 as described above is operated such that the inks are discharged respectively from the ink-jet head 4 carried on the carriage 3 onto the recording paper 100 placed on the platen 2, while moving the carriage 3 in the scanning direction. Further, the recording paper 100 is transported by a predetermined amount in the transport direction by means of the two transport rollers 18, 19. The ink discharge operation performed by the ink-jet head 4 and the transport operation for the recording paper 100 performed by the transport mechanism 5 as described above are alternately executed repeatedly, and thus an image or the like is printed on the recording paper 100.

Next, the ink-et head 4 will be explained with reference to FIGS. 2 to 7. In FIGS. 6 and 7, the ink, with which the interior of the ink flow passage in the ink-jet head 4 is filled, is shown by the hatching, and the symbol "1" is affixed thereto. As shown in FIGS. 2 to 7, the ink-jet head 4 is provided with a flow passage unit 20 and a piezoelectric actuator 21.

<Flow Passage Unit>

As shown in FIGS. 6 and 7, the flow passage unit 20 includes a stack 22 which is composed of five plates 24 to 28, and an ink sealing layer 23.

The plate 28 of the five plates 24 to 28 of the stack 22, which is disposed at the lowermost layer, is the nozzle plate for which the plurality of nozzles 30 are formed. On the other hand, the remaining four plates 24 to 27, which are disposed on the upper side, are formed with manifolds 32 which are communicated with the plurality of nozzles 30 and the ink flow passages which include, for example, pressure chambers 33. The materials of the five plates 24 to 28 are not specifically limited, for which it is possible to use those formed of metal materials including, for example, stainless steel and iron-nickel alloy (for example, 42 Alloy). It is unnecessary that all of the plates are any plate made of the same material. For example, it is also allowable that a plate of polyimide resin is used thr only the nozzle plate 28 in view of, for example, the nozzle processability, and the remaining four plates 24 to 27 are plates each of which is made of metal.

Figure 2:
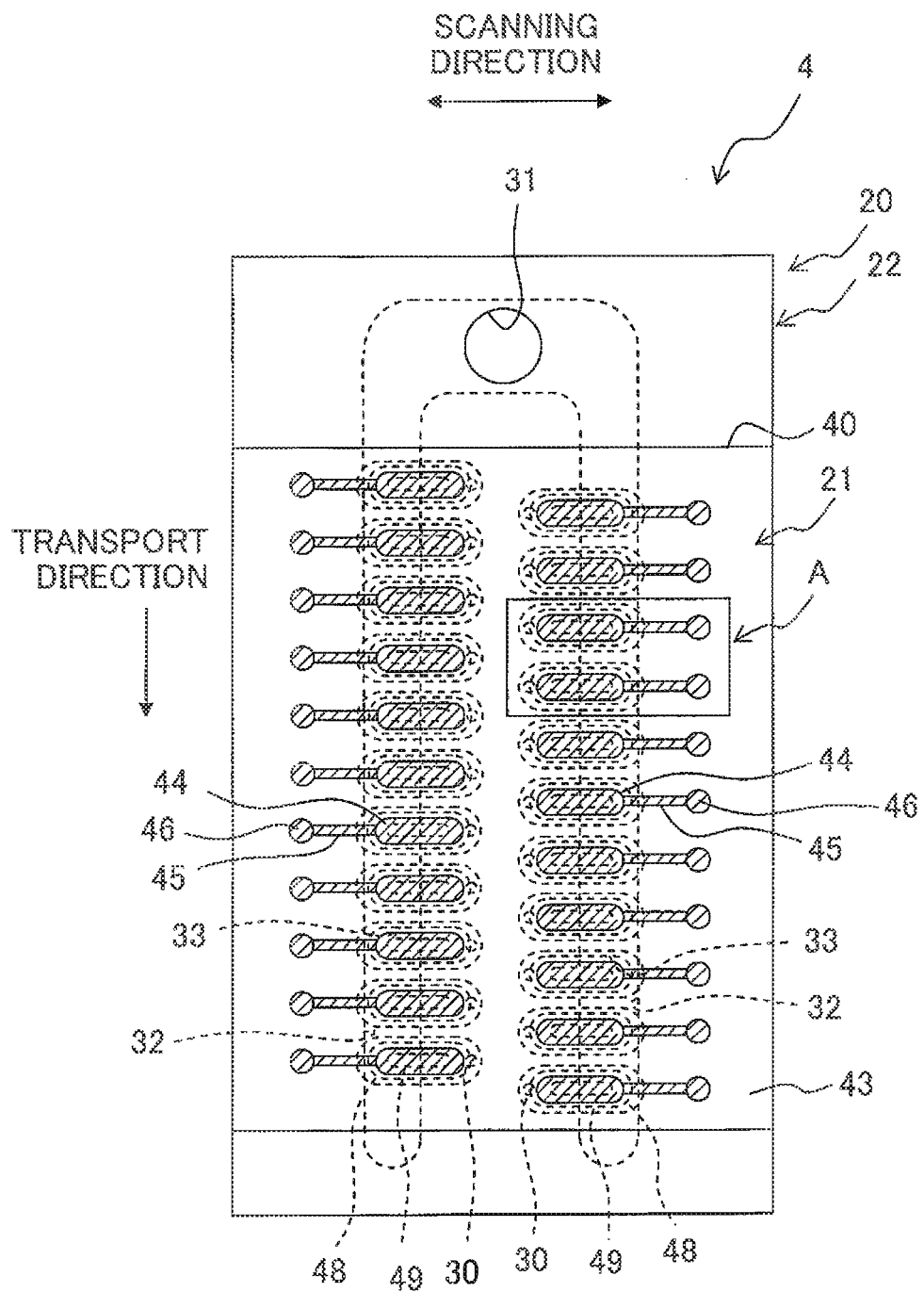
FIG. 2 shows a plan view illustrating an ink-jet head.
Figure 3:
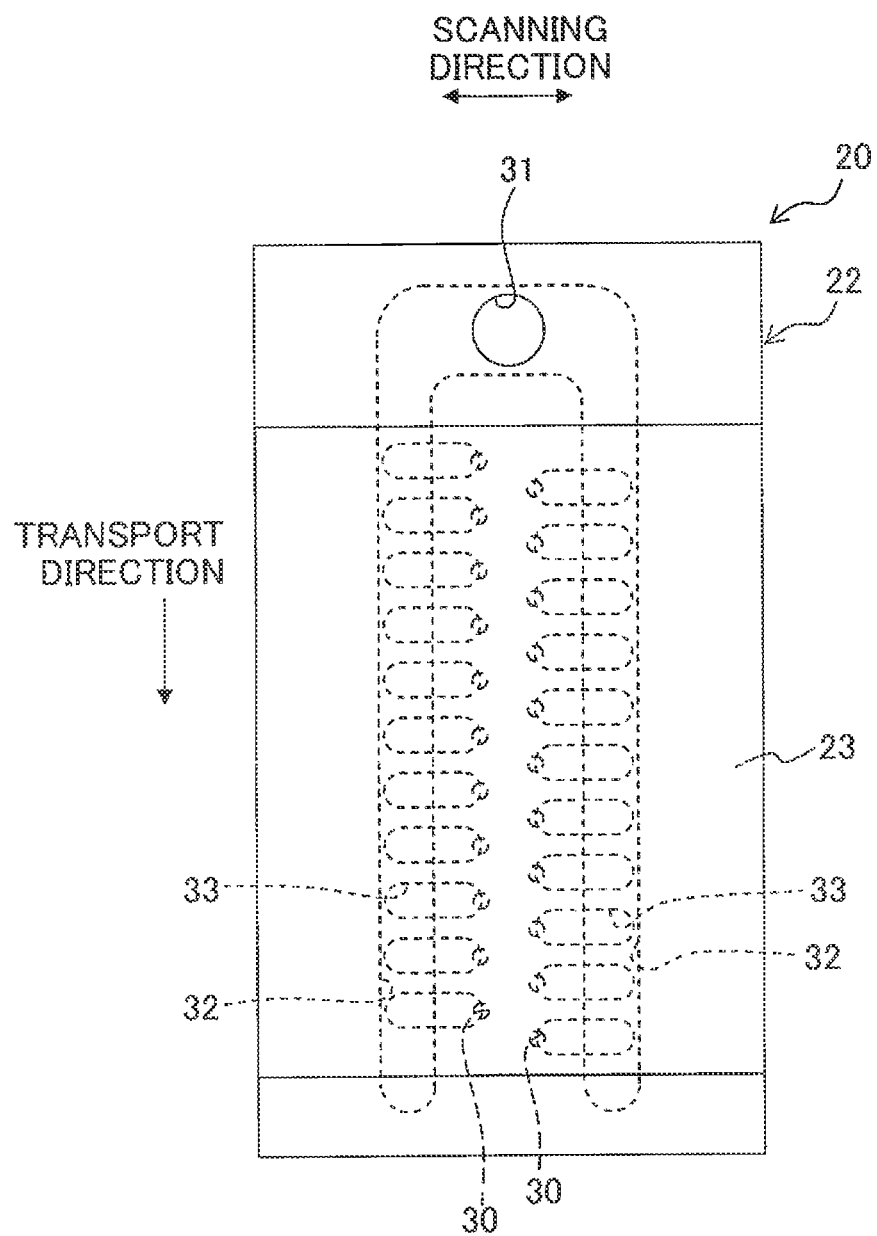
FIG. 3 shows a plan view illustrating a flow passage unit.

As shown in FIGS. 2 and 3, an ink supply hole 31 is formed at the upper surface of the stack 22. The ink supply hole 31 is connected to the ink cartridge 17 shown in FIG. 1. The two manifolds 32, which extend in the transport direction respectively, are formed at the inside of the stack 22. The two manifolds 32 are communicated with the ink supply hole 31.

The stack 22 has the plurality of nozzles 30, and the plurality of pressure chambers 33 corresponding to the plurality of nozzles 30 respectively. As shown in FIGS. 6 and 7, the plurality of nozzles 30 are formed through the nozzle plate 28 disposed at the lowermost layer, and the plurality of nozzles 30 are open while being directed downwardly. The plurality of nozzles 30 are arranged in a zigzag form in the transport direction, and the plurality of nozzles 30 constitute two arrays of nozzle arrays.

The plurality of pressure chambers 33 are formed on the plate 24 which is positioned at the uppermost layer of the stack 22. Each of the pressure chambers 33 has a substantially elliptical planner shape as viewed in the upward-downward direction. The pressure chambers 33 are arranged so that the longitudinal direction of the ellipse is parallel to the scanning direction. As shown in FIGS. 2 and 3, the pressure chambers 33 are arranged in a zigzag form in the transport direction in the same manner as the plurality of nozzles 30, and the pressure chambers 33 constitute two arrays of pressure chamber arrays corresponding to the two manifolds 32. Further, as shown in FIG. 6, each of the pressure chambers 33 is communicated with the corresponding manifold 32. As described above, as shown by the arrow in FIG. 6, a plurality of individual flow passages, which are branched from the respective manifolds 32 and which pass along the pressure chambers 33 to arrive at the nozzles 30, are formed in the stack 22.

The ink sealing layer 23 is joined to the upper surface of the plate 24 positioned at the uppermost layer of the stack 22 so that the plurality of pressure chambers 33 are covered therewith. The ink sealing layer 23 can be formed of for example, a metal thin plate or a synthetic resin film. However, it is preferable that the ink permeability of the ink sealing layer 23 is low. In this viewpoint, the metal material has such a structure that the internal microstructure is dense, and the permeability is generally low in relation to the liquid such as the ink or the like in the case of this material. On the other hand, the synthetic resin material is such a material that the ink is easily permeated as compared with the metal material. Therefore, when the synthetic resin film is adopted as the ink sealing layer 23, it is preferable that a permeation suppressing layer, which is composed of for example, a metal material, is provided on the surface of the film.

<Piezoelectric Actuator>

The piezoelectric actuator 21 is arranged while being brought in contact with the upper surface of the ink sealing layer 23 of the flow passage unit 20. The piezoelectric actuator 21 is provided with an actuator substrate 40, a common electrode 42, a piezoelectric layer 43, and a plurality of individual electrodes 44.

The actuator substrate 40 is joined to the upper surface of the ink sealing layer 23 of the flow passage unit 20 by means of for example, a thermosetting adhesive. The actuator substrate 40 is formed of single crystal silicon. The actuator substrate 40 has a vibration layer 41 which is provided at an upper portion thereof. The material of the vibration layer 41 is not specifically limited. However, for example, the vibration layer 41 of silicon dioxide or silicon nitride can be formed by applying the oxidation treatment or the nitriding treatment to the surface of the actuator substrate 40 of silicon. The thickness of the vibration layer 41 is, for example, about 0.5 to 0.8 μm.

Further, the actuator substrate 40 has a plurality of columnar portions 49 which are opposed to the plurality of pressure chambers 33 respectively between the vibration layer 41 and the ink sealing layer 23. In particular, a plurality of accommodating chambers 48 are formed at portions of the actuator substrate 40 opposed to the plurality of pressure chambers 33. The plurality of columnar portions 49 are accommodated respectively in the plurality of accommodating chambers 48. The accommodating chambers 48 are formed by holes 47 which extend from the lower surface of the actuator substrate 40 to arrive at the vibration layer 41. The accommodating chambers 48 are covered with the vibration layer 41 at the upper position, and the accommodating chambers 48 are covered with the ink sealing layer 23 at the lower position.

Figure 5:
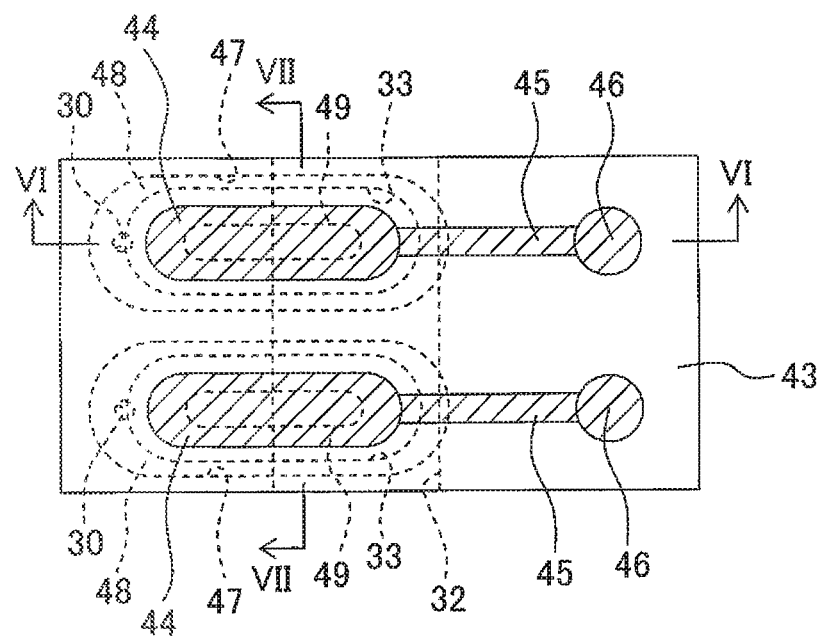
FIG. 5 shows an enlarged view illustrating Portion A shown in FIG. 2.
Figure 6:
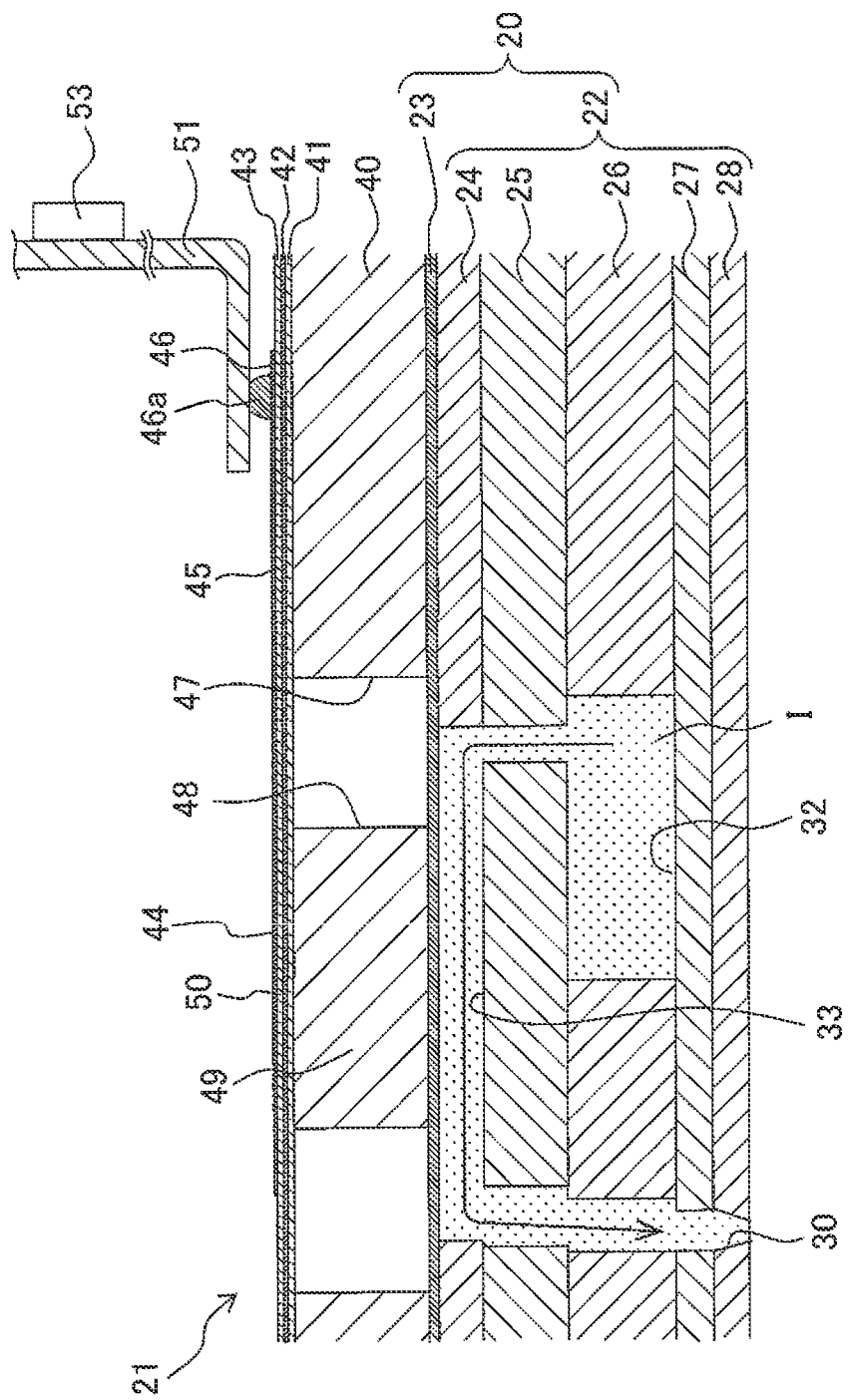
FIG. 6 shows a sectional view taken along a line VI-VI shown in FIG. 5.
Figure 7:
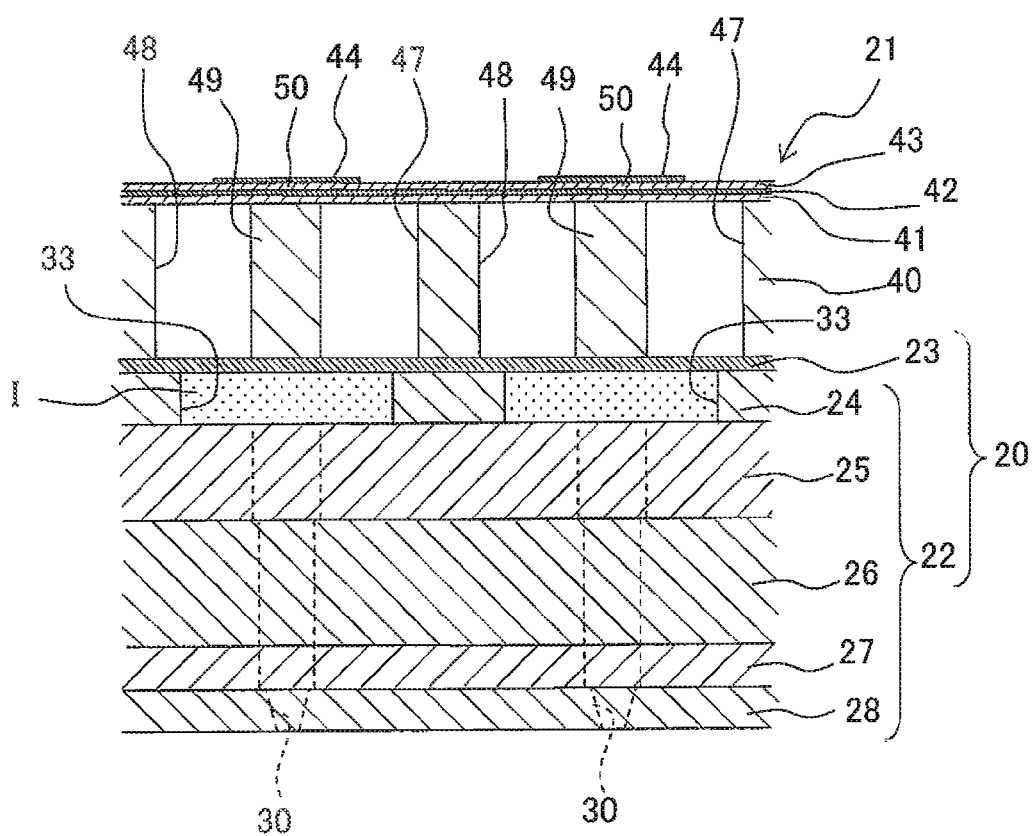
FIG. 7 shows a sectional view taken along a line VII-VII shown in FIG. 5.

As shown in FIGS. 5 to 7, one accommodating chamber 48 has a substantially elliptical planar shape which is one size larger than the pressure chamber 33 as viewed in the upward-downward direction perpendicular to the actuator substrate 40. The pressure chamber 33 is included in the accommodating chamber 48. The columnar portion 49 has a substantially elliptical planar shape which is smaller than the pressure chamber 33 as viewed in the upward-downward direction.

The lower end surface of the columnar portion 49 is brought in contact with the upper surface of the portion of the ink sealing layer 23 to cover the pressure chamber 33. On the other hand, the upper end surface of the columnar portion 49 is connected to the vibration layer 41.

The common electrode 42, the piezoelectric layer 43, and the plurality of individual electrodes 44 are stacked on the upper surface of the vibration layer 41 in this order from the bottom. The common electrode 42 is composed of an electrode material of, for example, Ti or Pt, and the common electrode 42 is formed on the substantially entire upper surface of the vibration layer 41. The thickness of the common electrode 42 is, for example, about 0.2 to 0.6 μm.

The piezoelectric layer 43 is formed over the substantially entire region of the upper surface of the vibration layer 41 by means of a known film formation method such as the sol-gel method or the like so that the common electrode 42 is covered therewith. The piezoelectric layer 43 is formed of a ferroelectric piezoelectric material. The ferroelectric piezoelectric material can be exemplified, for example, by lead titanate zirconate (PZT), lead titanate zirconate niobate (PZTN), and potassium sodium niobate. The thickness of the piezoelectric layer 43 is, for example, about 0.5 to 2.0 μm.

The plurality of individual electrodes 44 are composed of; for example, an electrode material such as Pt or the like, and the plurality of individual electrodes 44 are formed respectively in areas of the upper surface of the piezoelectric layer 43 opposed to the plurality of accommodating chambers 48. As shown in FIGS. 5 to 7, the individual electrode 44 also has a substantially elliptical planar shape as viewed in the upward-downward direction. The planar size of the individual electrode 44 is smaller than that of the accommodating chamber 48 and larger than that of the columnar portion 49. As shown in FIG. 5, the accommodating chamber 48, the individual electrode 44, and the columnar portion 49 are arranged in such a relationship that the individual electrode 44 is included at the inside of the accommodating chamber 48 and the columnar portion 49 is accommodated at the inside of the individual electrode 44 as viewed in the upward-downward direction. The thickness of the individual electrode 44 is, for example, about 0.2 to 0.6 μm.

Figure 4:
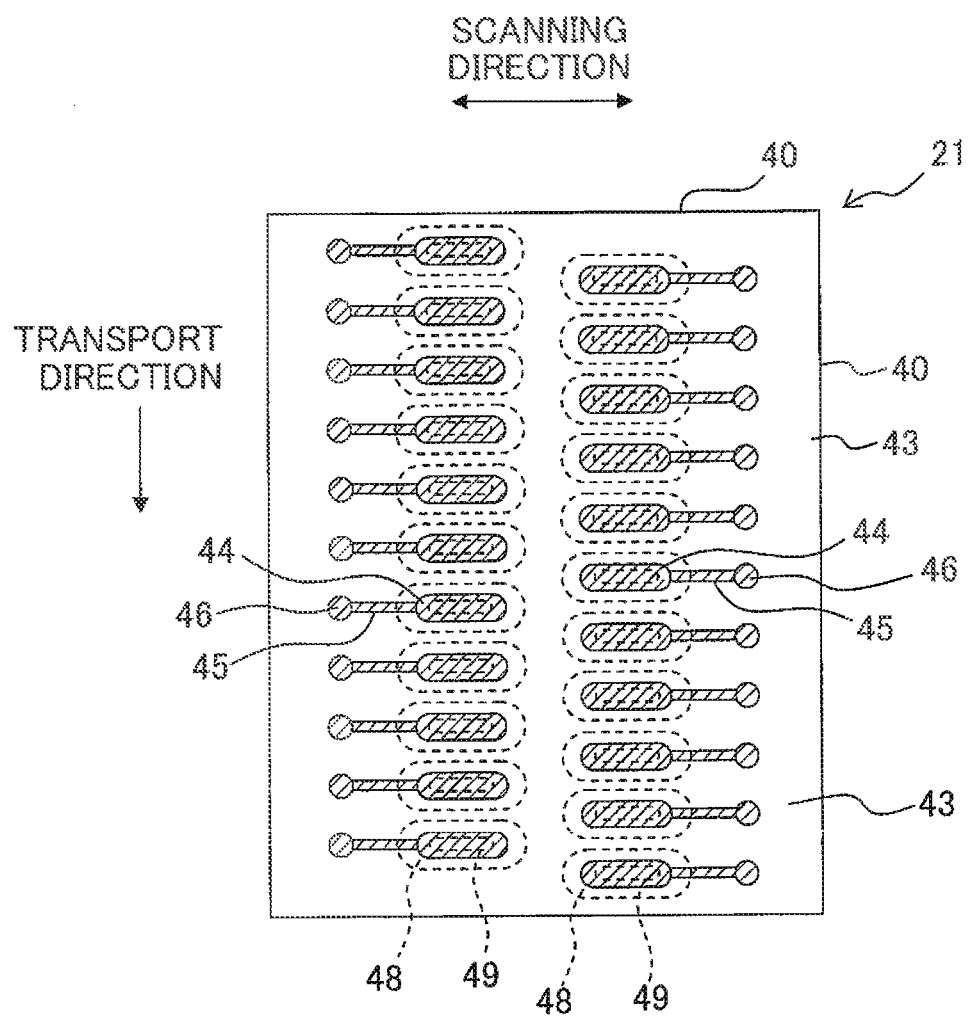
FIG. 4 shows a plan view illustrating a piezoelectric actuator.

As shown in FIGS. 4 to 6, a plurality of wiring portions 45, which are connected to the plurality of individual electrodes 44 respectively, are formed on the upper surface of the piezoelectric layer 43. Each of the wiring portions 45 is led out from the individual electrode 44 in the longitudinal direction of the individual electrode 44. A connecting terminal 46 is provided at the end portion of each of the wiring portions 45 disposed on the side opposite to the individual electrode 44. Protruding bumps 46a are provided for the plurality of connecting terminals 46 respectively. The bumps 46a of the plurality of connecting terminals 46 are joined to COF 51 (Chip On Film) as one type of the flexible circuit board, by means of, for example, an conductive adhesive or solder.

COF 51 is connected to an unillustrated control board. Driver IC 53 for driving the piezoelectric actuator 21 is mounted on COF 51. The driver IC 53 generates a driving signal having a predetermined driving waveform on the basis of a discharge control signal fed from the control board. The driving signal, which is generated by the driver IC 53, is outputted to the plurality of individual electrodes 44 respectively via the wiring lines on COF 51, the connecting terminals 46, and the wiring portions 45. The common electrode 42 is also joined to COF 51 at an unillustrated portion. The common electrode 42 is in conduction with the ground wiring line formed on COF 51, and the common electrode 42 is always retained at the ground electric potential.

The portion of the piezoelectric layer 43, which is interposed by the individual electrode 44 and the common electrode 42, is the portion at which the piezoelectric deformation is caused when the difference in electric potential arises between the individual electrode 44 and the common electrode 42. The portion of the piezoelectric layer 43 described above is hereinafter referred to as "piezoelectric element 50" (piezoelectric portion). The plurality of piezoelectric elements, which correspond to the plurality of pressure chambers 33, are polarized in the thickness direction respectively. In this embodiment, the piezoelectric layer 43 is formed on the substantially entire surface of the vibration layer 41, and the piezoelectric layer 43 commonly covers the plurality of accommodating chambers 48. Therefore, the plurality of piezoelectric elements are connected to one another in this arrangement. On the other hand, it is also allowable that the piezoelectric layer 43 is subjected to the patterning so that the plurality of piezoelectric elements 50, which correspond to the plurality of accommodating chambers 48 respectively, are separated from each other.

An explanation will be made about the operation of the piezoelectric actuator 21 to be performed when the driving signal is outputted from the driver IC 53 to the individual electrode 44. When the driving signal is supplied from the driver IC 53 to a certain individual electrode 44, the electric potential of the individual electrode 44 is changed with respect to the ground electric potential. Accordingly, the electric potential difference arises between the individual electrode 44 and the common electrode 42, and the electric field in the thickness direction acts on the piezoelectric element 50. The direction of the electric field is coincident with the polarization direction of the piezoelectric element 50, and hence the piezoelectric element 50 is shrunk in the in-plane direction (surface direction). In accordance with the shrinkage of the piezoelectric element 50, the portions of the piezoelectric layer 43 and the vibration layer 41, which correspond to the accommodating chamber 48, are flexibly bent or warped so that the portions protrude downwardly.

The columnar portion 49 is depressed downwardly in accordance with the warpage of the vibration layer 41 provided in this situation, and the columnar portion 49 presses the portion of the ink sealing layer 23 opposed to the pressure chamber 33. In this situation, the ink sealing layer 23 is flexibly bent or warped so that the ink sealing layer 23 protrudes toward the pressure chamber 33, and the volume in the pressure chamber 33 is decreased. In this way, the volume change is caused in the pressure chamber 33 by moving the columnar portion 49 upwardly/downwardly by driving the piezoelectric element 50. The pressure (discharge energy) is applied to the ink contained in the pressure chamber 33 in accordance with the volume change. Thus, the ink is discharged from the nozzle 30 communicated with the pressure chamber 33.

In the piezoelectric actuator 21 of this embodiment, the columnar portion 49 of the actuator substrate 40 intervenes between the piezoelectric element 50 (piezoelectric layer 43) and the pressure chamber 33 of the flow passage unit 20. Therefore, the piezoelectric element 50 is separated from the ink contained in the pressure chamber 33 in this arrangement. Therefore, any water content (moisture content), which is allowed to permeate through the ink sealing layer 23 from the pressure chamber 33, hardly arrives at the piezoelectric element 50. Therefore, it is possible to suppress the occurrence of any electric problem such as the short circuit formation, the migration or the like which would be otherwise caused in the piezoelectric element 50 resulting from the water content (moisture content).

In this embodiment, as shown in FIGS. 6 and 7, the upper end of the columnar portion 49 is connected to the vibration layer 41, and the lower end of the columnar portion 49 is always brought in contact with the ink sealing layer 23. Therefore, the deformation, which is caused in the vibration layer 41, can be reliably transmitted to the ink sealing layer 23 by means of the columnar portion 49.

Next, an explanation will be made about a production method for producing the ink-jet head 4 described above. In this embodiment, a method is adopted, in which the flow passage unit 20 and the piezoelectric actuator 21 are manufactured distinctly or separately respectively, and then the both are joined to one another.

<Step of Producing Flow Passage Unit>

The production of the flow passage unit 20 having the structure stacked with the plurality of plates is the technique having been conventionally known, which will be briefly described with reference to FIGS. 6 and 7. At first, holes for forming the flow passage portions including, for example, the nozzles 30, the pressure chambers 33, and the manifolds are formed respectively through the five plates 24 to 28 for constructing the stack 22 by means of any known processing technique such as the etching, the laser processing or the like. Subsequently, the five plates 24 to 28 are mutually stacked and joined to one another, for example, by using a thermosetting adhesive to obtain the stack 22. Further, the ink sealing layer 23, which is composed of, for example, a synthetic resin film or a metal film, is joined to the plate 24 of the stack 22 so that the plurality of pressure chambers 33 are covered therewith, and thus the production of the flow passage unit 20 is completed.

<Step of Producing Actuator>

(1) Step of Forming Vibration Layer

Figure 8A:
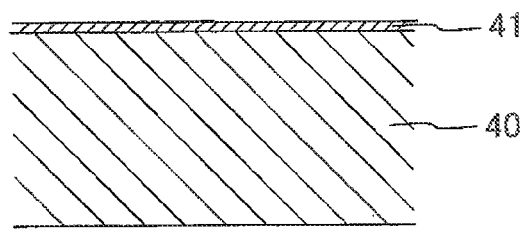
FIGS. 8A to 8D illustrate production steps of producing the inkjet head.

At first, as shown in FIG. 8A, the oxidation treatment or the nitriding treatment is applied to the upper surface of the actuator substrate 40 cut out from a silicon single crystal wafer, and thus the vibration layer 41 of silicon dioxide or silicon nitride is formed. The thickness of the vibration layer 41 may be, for example, about 1 µm.

(2) Step of Forming Piezoelectric Element

Figure 8B:
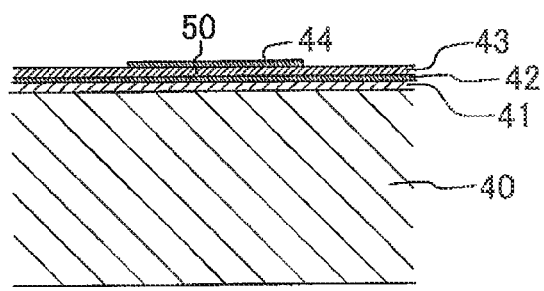

Subsequently, the plurality of piezoelectric elements 50 are formed on the upper surface of the vibration layer 41. At first, as shown in FIG. 8B, the common electrode 42 is formed as the film in the substantially entire region of the upper surface of the vibration layer 41 by means of, for example, the vacuum deposition method or the sputtering method. Subsequently, the piezoelectric layer 43 is thrilled as the film so that the common electrode 42 is entirely covered therewith by means of, for example, the sol-gel method or the MOD method. Subsequently, a conductive film is formed as the film by means of the vacuum deposition method or the sputtering method on the upper surface of the piezoelectric layer 43, and then the patterning is performed for the conductive film to form a conductive pattern including the plurality of individual electrodes 44, the plurality of wiring portions 45, and the plurality of connecting terminals 46. Accordingly, the plurality of piezoelectric elements 50, which are interposed by the plurality of individual electrodes 44 and the common electrode 42, are formed on the upper surface of the vibration layer 41. The thicknesses of the piezoelectric layer 43, the individual electrode 44, and the common electrode 42 may be about 1 µm respectively.

(3) Etching Step

Figure 8C:
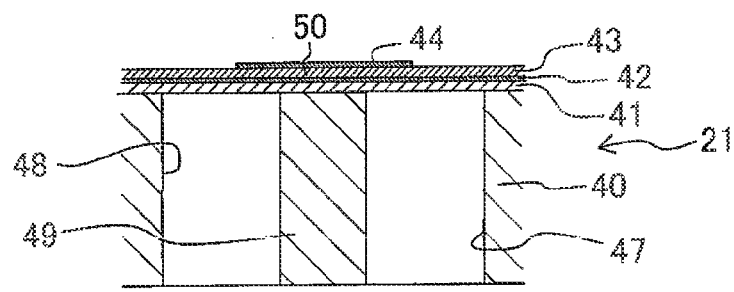

Subsequently, as shown in FIG. 8C, the etching is performed from the lower surface side of the actuator substrate 40 disposed on the side opposite to the vibration layer 41 to form, on the actuator substrate 40, the plurality of columnar portions 49 and the plurality of accommodating chambers 48 (recessed holes 47) which surround the plurality, of columnar portions 49 respectively. The etching may be either the wet etching or the dry etching. However, the wet etching is advantageous in view of the fact that the etching can be performed in a short period of time because the etching speed is fast.

A specified example will be described when the etching is performed by means of the wet etching. At first, a mask film, which has the resistance to the etching solution (for example, KOH solution), is formed on the side surface of the actuator substrate 40. The mask film is, for example, silicon dioxide. The vibration layer 41 described above also has the resistance to the etching solution, and the vibration layer 41 functions as a mask film on the upper surface of the actuator substrate 40. Further, a mask film, which corresponds to the plurality of accommodating chambers 48 (holes 47), is formed on the lower surface of the actuator substrate 40. In addition, the wet etching is performed from the lower surface of the actuator substrate 40, and the plurality of holes 47 are formed in the areas not covered with the mask film. During this process, the vibration layer 41, which is formed on the upper surface of the actuator substrate 40, also functions as the etching stopper layer so that the holes 47 do not penetrate through the actuator substrate 40 and the vibration layer 41 when the holes 47 are formed by the etching from the side of the lower surface.

<Joining Step>

Figure 8D:
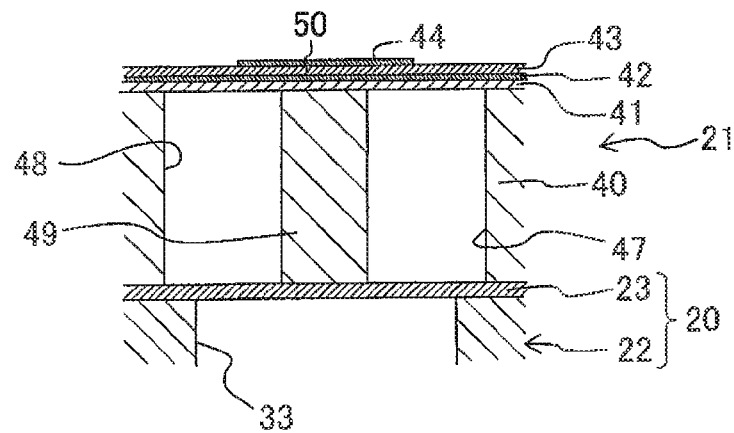

The flow passage unit 20 and the piezoelectric actuator 21, which are produced or manufactured as described above, are joined to one another. As shown in FIG. 8D, the actuator substrate 40 of the piezoelectric actuator 21 is adhered to the upper surface of the ink sealing layer 23 of the flow passage unit 20 by using, for example, a thermosetting adhesive.

After the joining step, for example, COF 51 is joined to the piezoelectric actuator 21, and the production of the ink-jet head 4 is completed.

The piezoelectric actuator 21 of this embodiment is provided with the actuator substrate 40 having the plurality of columnar portions 49 between the flow passage unit 20 and the plurality of piezoelectric elements 50. In this arrangement, the deformation, which is generated in the vibration layer 41 when the piezoelectric element 50 is driven, is transmitted by the columnar portion 49 to the ink sealing layer 23 of the flow passage unit 20. However, it is unnecessary that the length of the columnar portion 49 should be especially shortened. Therefore, it is unnecessary that the thickness of the actuator substrate 40 should be suppressed to be small so that the thickness is not more than a certain value. In other words, it is unnecessary to process and thin the actuator substrate 40 by means of, for example, the polishing.

Therefore, the handling of the actuator substrate 40 is easily performed in the production steps of producing the actuator as described above. Further, it is unnecessary to join any other silicon substrate or the like to the actuator substrate 40 in order to improve the handling performance during the production steps of producing the actuator substrate 40. It is possible to decrease the number of silicon wafers to be used. Further, it is possible to adopt such a method that the flow passage unit 20, for which the ink flow passage is formed, is formed of any material other than silicon and the flow passage unit 20 is thereafter joined to the piezoelectric actuator 21.

In this embodiment, for example, a silicon wafer having a thickness of several hundreds of µm can be also used as it is as the actuator substrate 40 without thinning the thickness by performing the polishing. Therefore, it is possible to reduce the production cost by omitting the polishing step. It is of course allowable to appropriately perform the polishing step in order to adjust the thickness of the actuator substrate 40.

Even in this case, it is unnecessary to greatly decrease the thickness of the actuator substrate 40. Therefore, the polishing step is simplified, which results in the reduction of the production cost.

The inkjet head 4 of this embodiment corresponds to the liquid discharge apparatus of the present invention. The flow passage unit 20 corresponds to the flow passage structure of the present invention. The ink sealing layer 23 corresponds to the liquid sealing layer of the present invention.

Next, an explanation will be made about modified embodiments to which various modifications are applied to the embodiment described above. However, those constructed in the same manner as those of the embodiment described above are designated by the same reference numerals, any explanation of which will be appropriately omitted.

In order that the ink sealing layer 23 is greatly deformed to increase the volume change of the pressure chamber 33, it is preferable that the pressing force of the columnar portion 49, which is provided when the vibration layer 41 is deformed, is allowed to act while being dispersed in a wide range of the ink sealing layer 23. However, on the other hand, if the entire columnar portion 49 is made big or thick, then the areal size (area) of the upper end surface of the columnar portion 49 brought in contact with the vibration layer 41 is increased, and the deformation of the vibration layer 41 is inhibited.

First Modified Embodiment

Figure 9:
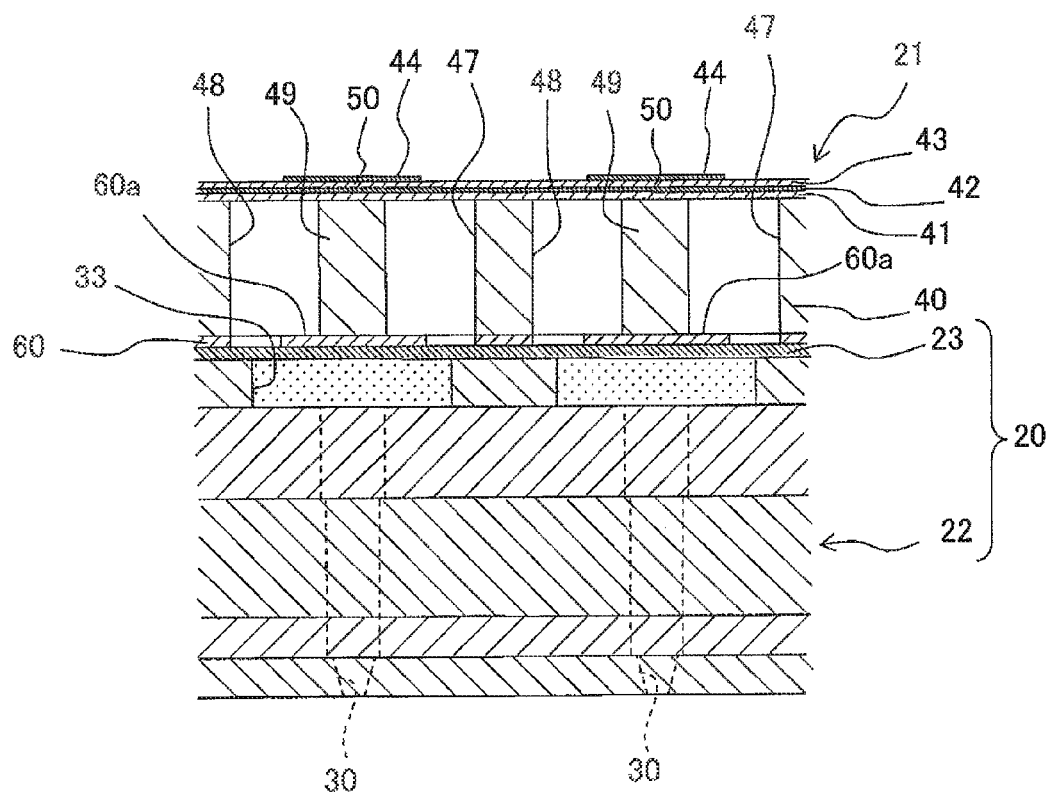
FIG. 9 shows a sectional view corresponding to FIG. 7 illustrating a first modified embodiment.

In relation to the viewpoint as described above, as shown in FIG. 9, a film member 60 may be overlapped or overlaid on the area of the ink sealing layer 23 to be pressed by the columnar portion 49, in which the columnar portion 49 is to be pressed and allowed to abut against the area. In FIG. 9, the film member 60 is allowed to intervene between the actuator substrate 40 and the ink sealing film 23. The areal size of the portion 60*a* of the film member 60 disposed between the lower end surface of the columnar portion 49 and the ink sealing film 23 is smaller than that of the pressure chamber 33, but the areal size is larger than that of the lower end of the columnar portion 49. In accordance with this arrangement, the pressing force of the columnar portion 49 can be allowed to act in a wide range of the ink sealing layer 23 as compared with the case in which the columnar portion 49 directly presses the ink sealing layer 23. In FIG. 9, the film member 60 is arranged on the side of the columnar portion 49 with respect to the ink sealing layer 23. However, it is also allowable that the film member 60 is arranged on the side opposite to the columnar portion 49 with respect to the ink sealing layer 23, i.e., at the inside of the pressure chamber 33.

The larger the rigidity of the film member 60 is, the larger the volume change of the pressure chamber 33 can be made. Accordingly, it is preferable that the rigidity of the film member 60 is larger than the rigidity of the ink sealing layer 23. The "rigidity" herein refers to the flexural rigidity EI which is determined by the elastic modulus E of the member and the geometrical moment of inertia (moment of inertia of area) I decided, for example, from the thickness of the member. Therefore, in order that the rigidity of the film member 60 is larger than the rigidity of the ink sealing layer 23, the film member 60 is formed of a material having an elastic modulus E larger than that of the ink sealing layer 23. For example, when the ink sealing layer 23 is a synthetic resin film, the film member 60 is a thin metal plate. Alternatively, it is appropriate that the thickness of the film member 60 is made larger than the thickness of the ink sealing layer 23.

Second Modified Embodiment

It is also appropriate that the columnar portion 49 is formed to have a tapered shape having diameters increasing at lower positions in the downward direction in which the areal size of the lower end surface of the columnar portion 49 disposed on the side of the ink sealing layer 23 is larger than the areal size of the upper end surface disposed on the side of the vibration layer 41. In this arrangement, the ink sealing layer 23 can be pressed in a wide range owing to the lower end surface of the columnar portion 49 having the large areal size. On the other hand, the areal size of the upper end surface of the columnar portion 49 is small, and hence the deflective deformation (flexible deformation) of the vibration layer 41 is hardly inhibited by the columnar portion 49.

Third Modified Embodiment

Figure 10:
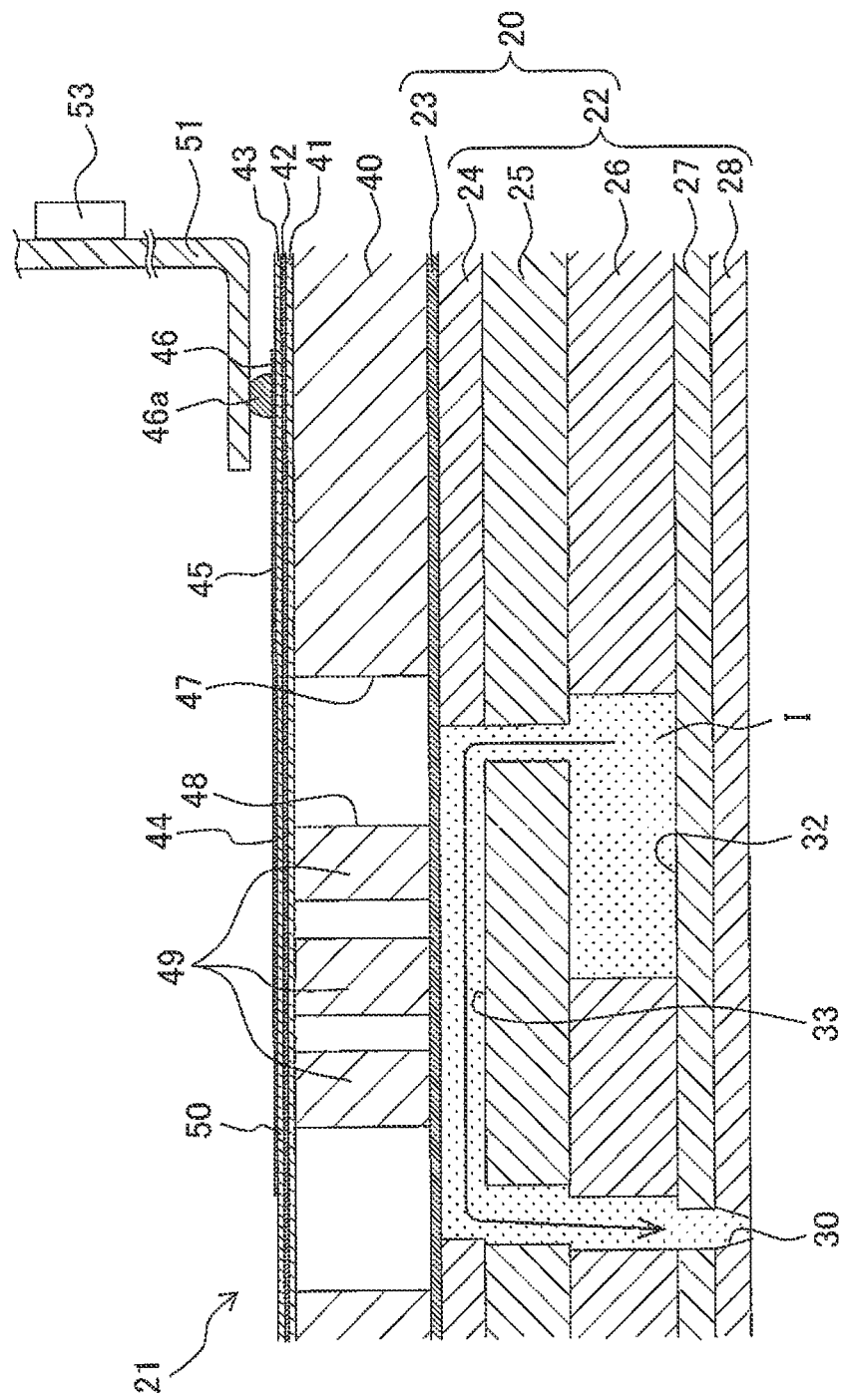
FIG. 10 shows a sectional view corresponding to FIG. 6 illustrating a third modified embodiment.

A plurality of columnar portions 49 may be arranged opposingly with respect to one pressure chamber 33. For example, in FIG. 10, three columnar portions 49 are arranged with respect to one pressure chamber 33.

Fourth Modified Embodiment

Figure 11:
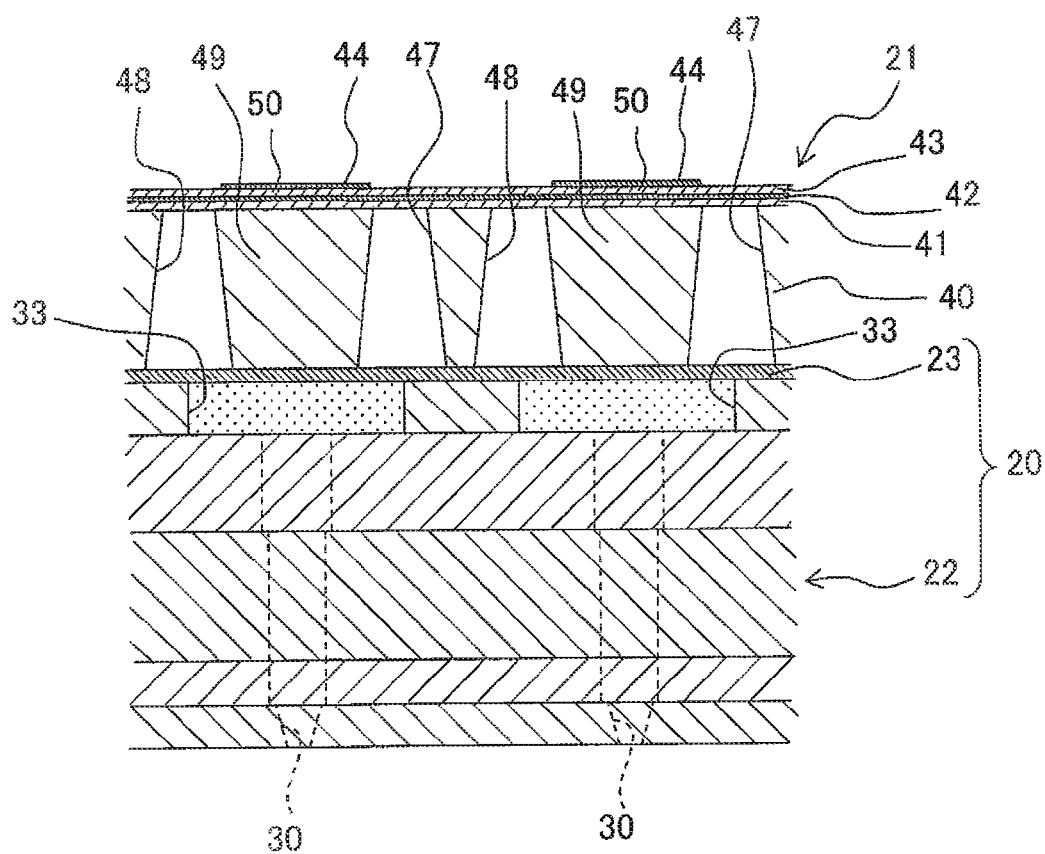
FIG. 11 shows a sectional view corresponding to FIG. 7 illustrating a fourth modified embodiment.

As shown in FIG. 11, it is also appropriate that the columnar portion 49 is formed to have a tapered shape having diameters decreasing at lower positions in the downward direction in which the areal size of the lower end surface of the columnar portion 49 disposed on the side of the ink sealing layer 23 is smaller than the areal size of the upper end surface disposed on the side of the vibration layer 41.

If the areal size of the lower end surface of the columnar portion 49 disposed on the side of the ink sealing layer 23 is large, the distance between the outer edge of the lower end of the columnar portion 49 and the inner edge of the pressure chamber 33 is shortened as viewed in the upward-downward direction. In this case, when the flow passage unit 20 and the piezoelectric actuator 21 are joined to one another, if the position of the columnar portion 49 is deviated only a little with respect to the pressure chamber 33, then the displacement amount of the ink sealing layer 23 is greatly changed, i.e., the sensitivity of the displacement amount change of the ink sealing layer 23 with respect to the positional deviation of the columnar portion 49 is sharpened. On the contrary, in the fourth modified embodiment, the areal size of the end surface of the columnar portion 49 disposed on the side of the ink sealing layer 23 is small. Therefore, the distance from the outer edge of the lower end of the columnar portion 49 to the inner edge of the pressure chamber 33 is increased. Accordingly, even when the columnar portion 49 is positionally deviated to some extent with respect to the pressure chamber 33, the displacement amount of the ink sealing layer 23 is not greatly changed. The same effect as that described above can be also obtained by thinning the thickness of the entire columnar portion 49. However, if the columnar portion 49 is too thin, then the strength of the columnar portion 49 is insufficient, and it is feared that any breakage may arise, thr example, such that the columnar portion 49 is cracked and/or broken as the piezoelectric element 50 is repeatedly driven. Therefore, it is preferable that only the lower end portion is thinned without thinning the entire columnar portion 49.

Fifth Modified Embodiment

Figure 12:
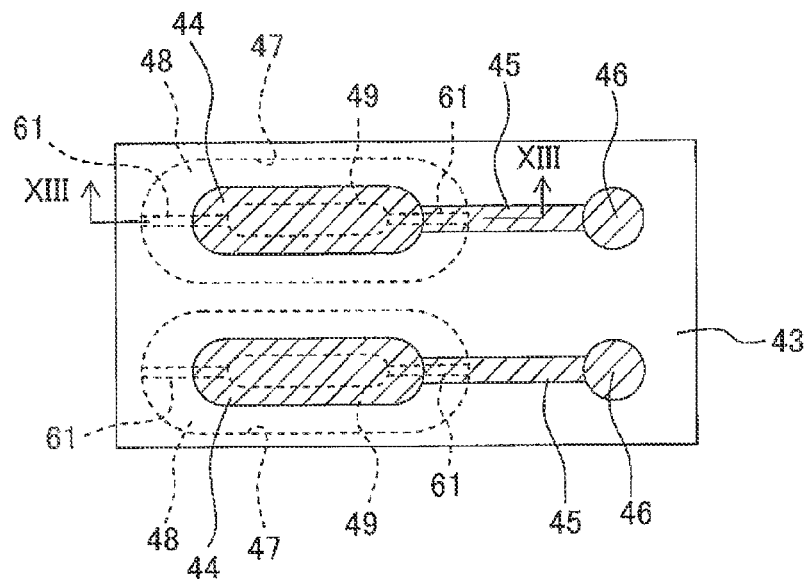
FIG. 12 shows a partial enlarged view illustrating a piezoelectric actuator of a fifth modified embodiment.
Figure 13:
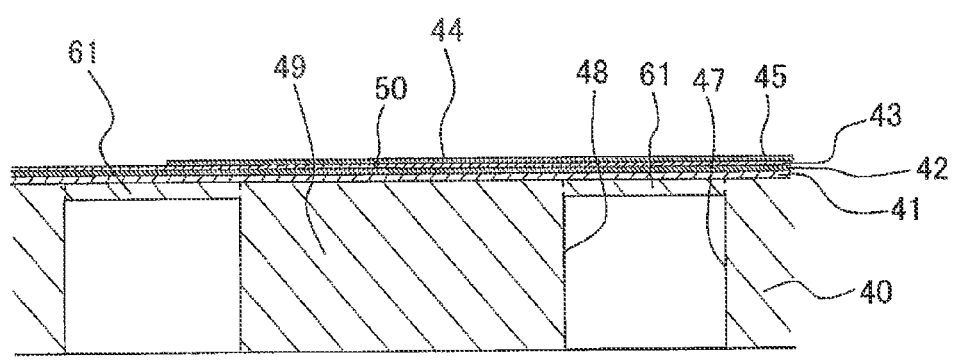
FIG. 13 shows a sectional view taken along a line shown in FIG. 12.

It is also appropriate to provide any structure which reinforces the portion of the vibration layer 41 to cover the accommodating chamber 48. For example, as shown in FIGS. 12 and 13, two support portions 61 are provided at upper end positions of the accommodating chamber 48 so that the outer side surface of the columnar portion 49 and the inner wall surface of the accommodating chamber 48 (hole 47) are connected to one another. The vibration layer 41 is connected to not only the columnar portion 49 but also the two support portions 61. The portion of the vibration layer 41 to cover the accommodating chamber 48 is supported by the two support portions 61. It is preferable that the support portion 61 is provided at such a position that the distance between the outer side surface of the columnar portion 49 and the inner wall surface of the accommodating chamber 48 is maximized. In FIG. 12, the two support portions 61 are arranged so that the both end portions in the longitudinal direction of the columnar portion 49 having the elliptical planar shape and the both end portions in the longitudinal direction of the accommodating chamber 48 having the elliptical planar shape as well are connected to one another.

Sixth Modified Embodiment

Figure 14:
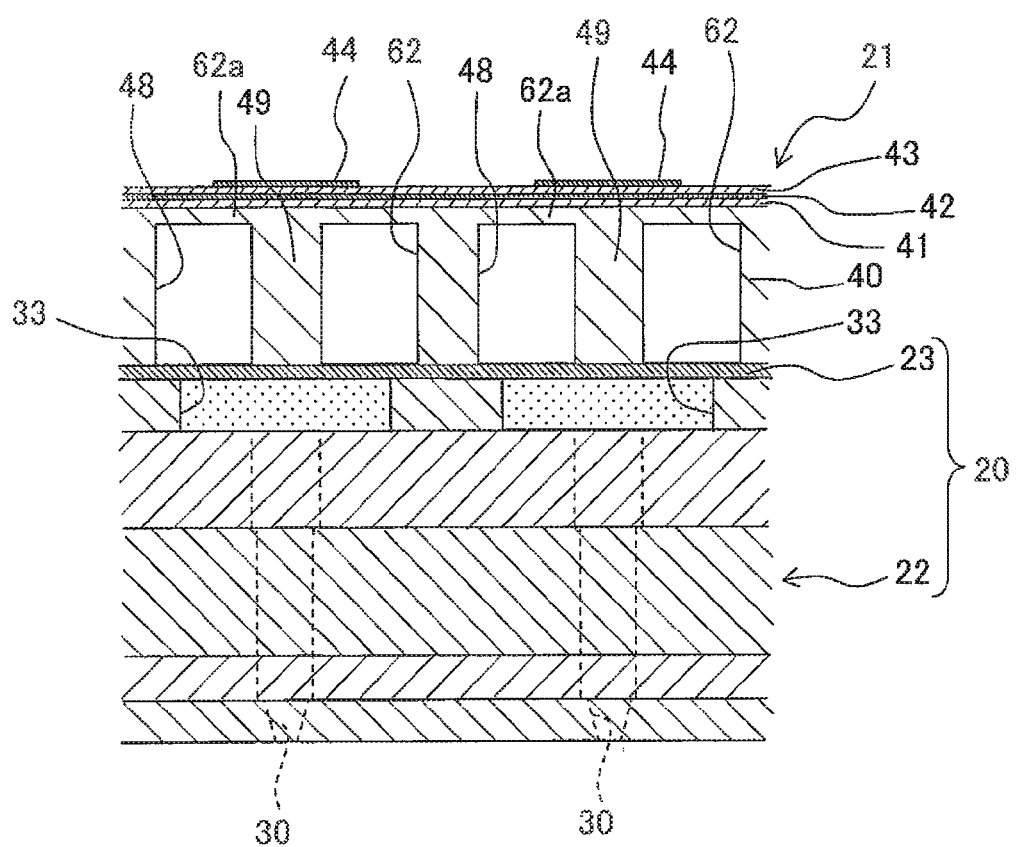
FIG. 14 shows a sectional view corresponding to FIG. 7 illustrating a sixth modified embodiment.

In the embodiment described above, as shown in FIGS. 6 and 7, the hole 47, which arrives at the vibration layer 41, is formed for the actuator substrate 40, and the columnar portion 49 is accommodated in the accommodating chamber 48 formed by the hole 47. Alternatively, as shown in FIG. 14, it is also appropriate to adopt such an arrangement that recessed holes 62, in which upper ends do not arrive at the vibration layer 41, are formed for the actuator substrate 40, and columnar portions 49 are formed in the recesses holes 62 (sixth modified embodiment). The recessed holes 62 can be formed such that the etching step shown in FIG. 8C is stopped before the etching solution arrives at the vibration layer 41.

In other words, the arrangement of the sixth embodiment can be expressed as follows. That is, the upper end of the columnar portion 49 is not directly connected to the vibration layer 41, but a wall portion 62a, which forms the ceiling of the recessed hole 62, intervenes between the columnar portion 49 and the vibration layer 41. In this arrangement, the wall portion 62a of the recessed hole 62 exists under the vibration layer 41, and thus the vibration layer 41 is substantially thickened. Therefore, this arrangement is advantageous in view of the reinforcement of the vibration layer 41. However, it is difficult for the vibration layer 41 to be flexibly bent or warped in the upward-downward direction. Therefore, this arrangement is disadvantageous in view of the deformation efficiency.

As described in the foregoing embodiment, the actuator substrate 40 has the thickness of not less than the certain value. Therefore, any space, which is usable for various ways of use, can be formed in any vacant portion of the actuator substrate 40 in which the columnar portion 49 is not formed.

Seventh Modified Embodiment

Figure 15:
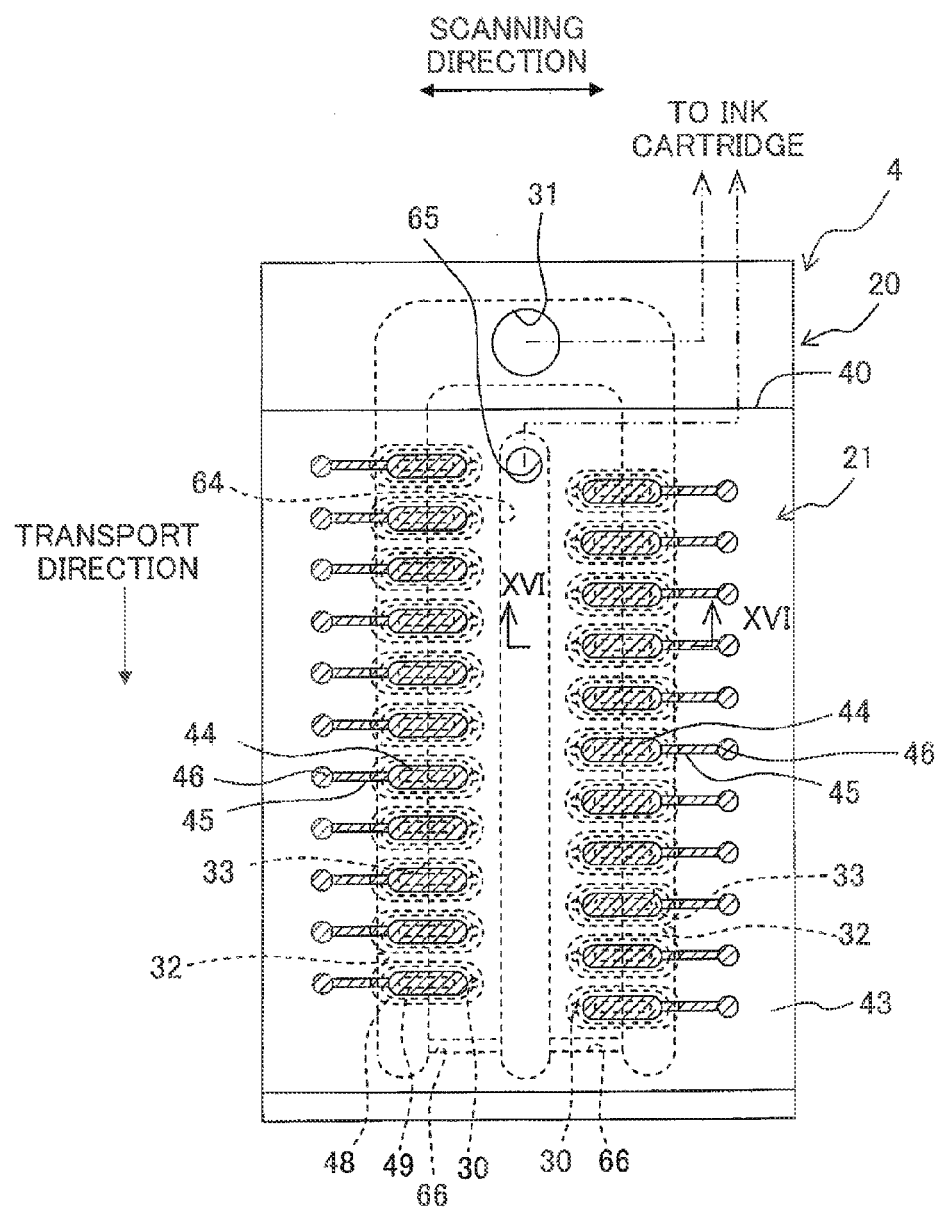
FIG. 15 shows a plan view illustrating an inkjet head of a seventh modified embodiment.

A part of the flow passage for allowing the ink to flow therethrough can be formed in the actuator substrate 40. For example, in an example shown in FIG. 15, a communication flow passage 64, which extends in the arrangement direction, is formed between the arrays of two arrays of the accommodating chambers 48 corresponding to the arrays of two arrays of the pressure chambers. The end portion of the communication flow passage 64, which is disposed on the upstream side in the transport direction, is communicated with a communication hole 65 formed on the upper surface of the actuator substrate 40. The ink cartridge 17 (see FIG. 1) is connected to the communication hole 65 in the same manner as the ink supply hole 31 formed thr the flow passage unit 20. On the other hand, the end portion of the communication flow passage 64, which is disposed on the downstream side in the transport direction, is communicated with the two manifolds 32 positioned on the both sides of the communication flow passage 64, via flow passages 66 formed for the flow passage unit 20.

In other words, the communication flow passage 64 is communicated with the ink cartridge 17 at the end portion disposed on the upstream side in the transport direction, and the communication flow passage 64 is communicated with the two manifolds 32 at the end portion disposed on the downstream side in the transport direction. Therefore, a part of the ink supplied from the ink cartridge 17 via the ink supply port 31 to the manifold 32 can be returned from the communication flow passage 64 to the ink cartridge 17. Accordingly, any bubble, which is mixed into the manifold 32 and which grows therein, can be fed to the ink cartridge 17 via the communication flow passage 64 without discharging the bubble from the nozzles 30 by means of the purge. The communication flow passage 64 is positioned at the position not overlapped with the accommodating chamber 48, and hence the communication flow passage 64 is disposed at the position deviated from the piezoelectric element 50 as well. Therefore, even when the water content in the communication flow passage 64 permeates through the vibration layer 41, then the water content hardly arrives at the piezoelectric element 50, and any harmful influence is hardly exerted on the piezoelectric element 50.

In the seventh modified embodiment, the ink cartridge 17 corresponds to the liquid storage unit of the present invention. If any ink storage unit, which is distinct from the ink cartridge 17, is provided between the ink cartridge 17 and the inkjet head 4, for example, in order to absorb the pressure fluctuation of the ink, the communication flow passage 64 may be connected to the ink storage unit. In this arrangement, the ink storage unit corresponds to the liquid storage unit of the present invention.

Figure 16:
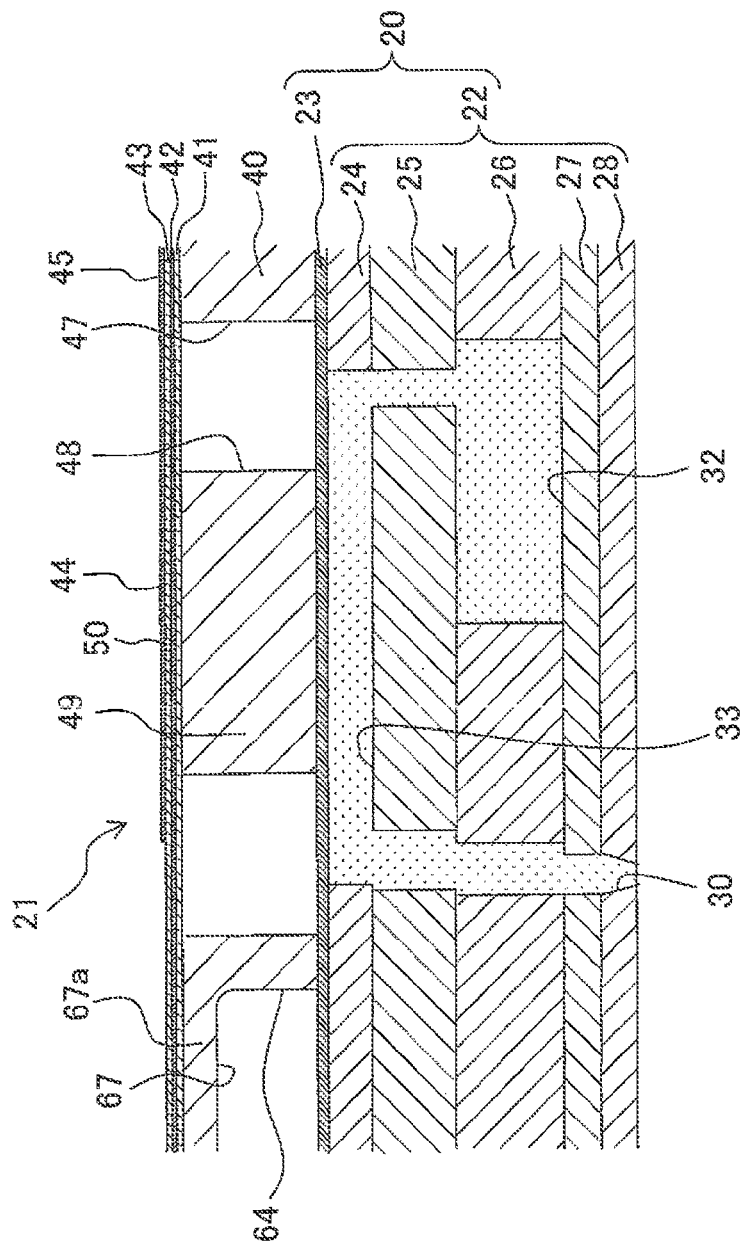
FIG. 16 shows a sectional view taken along a line XVI-XVI shown in FIG. 15.

The shape of the communication flow passage 64 is not specifically limited. However, an example is shown below. In FIG. 16, a recessed flow passage hole 67, which is open on the side of the ink sealing layer 23 and which has the upper end not arriving at the vibration layer 41, is formed for the actuator substrate 40. The space in the flow passage hole 67 is the communication flow passage 64. In this arrangement, a wall portion 67a, which forms the ceiling portion of the flow passage hole 67, exists between the communication flow passage 64 and the vibration layer 41. The ink contained in the communication flow passage 64 is not brought in contact with the vibration layer 41. Therefore, it is not feared that the ink contained in the communication flow passage 64 penetrates through the vibration layer 41. Further, any decrease in the strength of the vibration layer 41, which would be otherwise caused by the formation of the communication flow passage 64, is suppressed.

If only the vibration layer 41 exists over or above the communication flow passage 64, it is difficult to lay out the wiring portion 45 connected to the individual electrode 44, at the position disposed just over the communication flow passage 64, because the strength of the vibration layer 41 is weak. On the contrary, in the case of the arrangement shown in FIG. 16, such a structure is provided that the vibration layer 41 is reinforced by the wall portion 67a of the flow passage hole 67. Therefore, it is possible to lay out the wiring portion 45 for the portion of the vibration layer to cover the communication flow passage 64 as well. For example, with reference to FIG. 15, the plurality of wiring portions 45, which are connected to the arrays of the individual electrodes 44 disposed on the left side, can be laid out to the right side while striding over the communication flow passage 64. In this way, even when the communication flow passage 64 is formed for the actuator substrate 40, the degree of freedom of arrangement of the wiring portion 45 is not lowered.

Eighth Modified Embodiment

Figure 17:
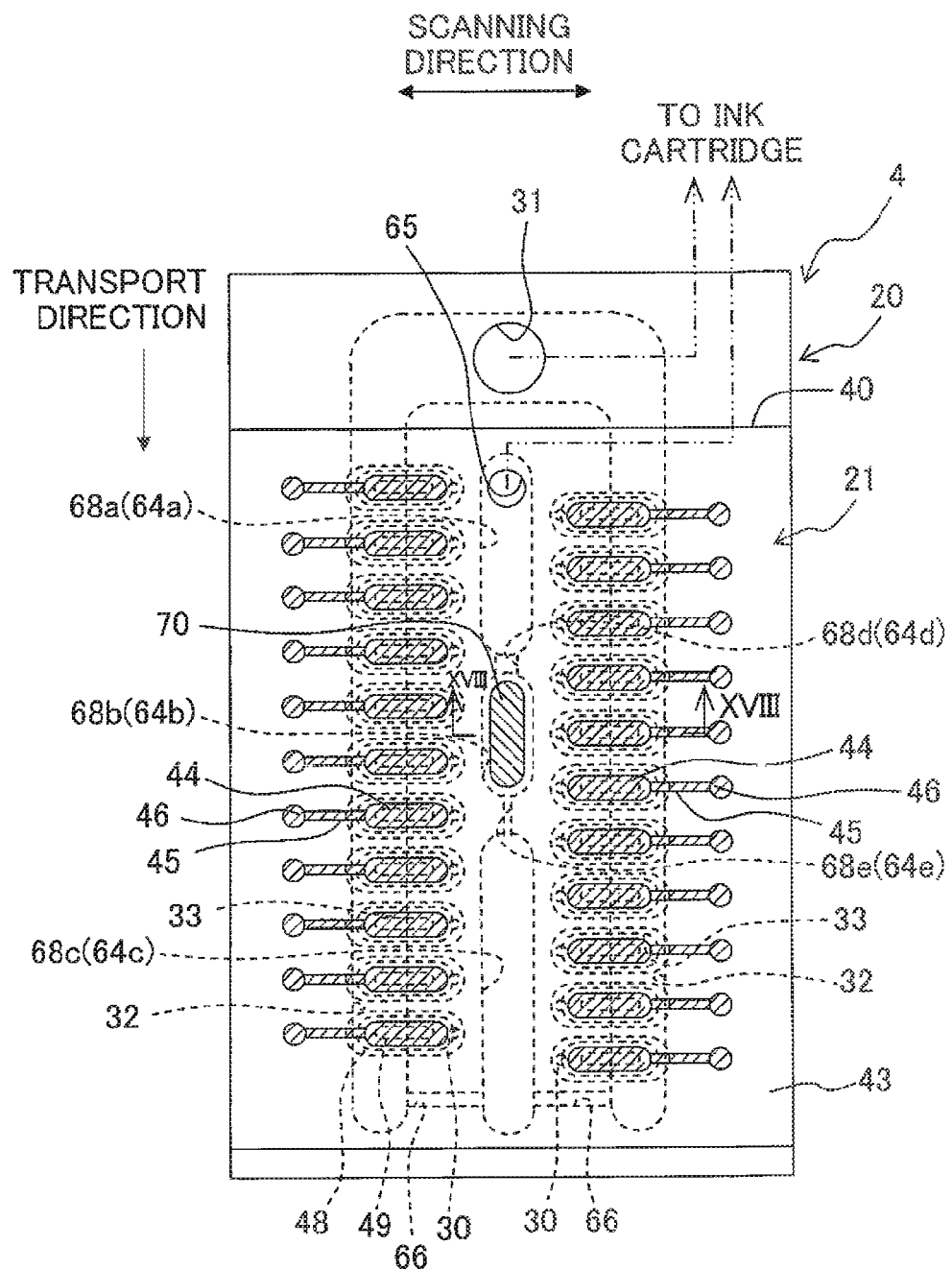
FIG. 17 shows a plan view illustrating an inkjet head of an eighth modified embodiment.
Figure 18:
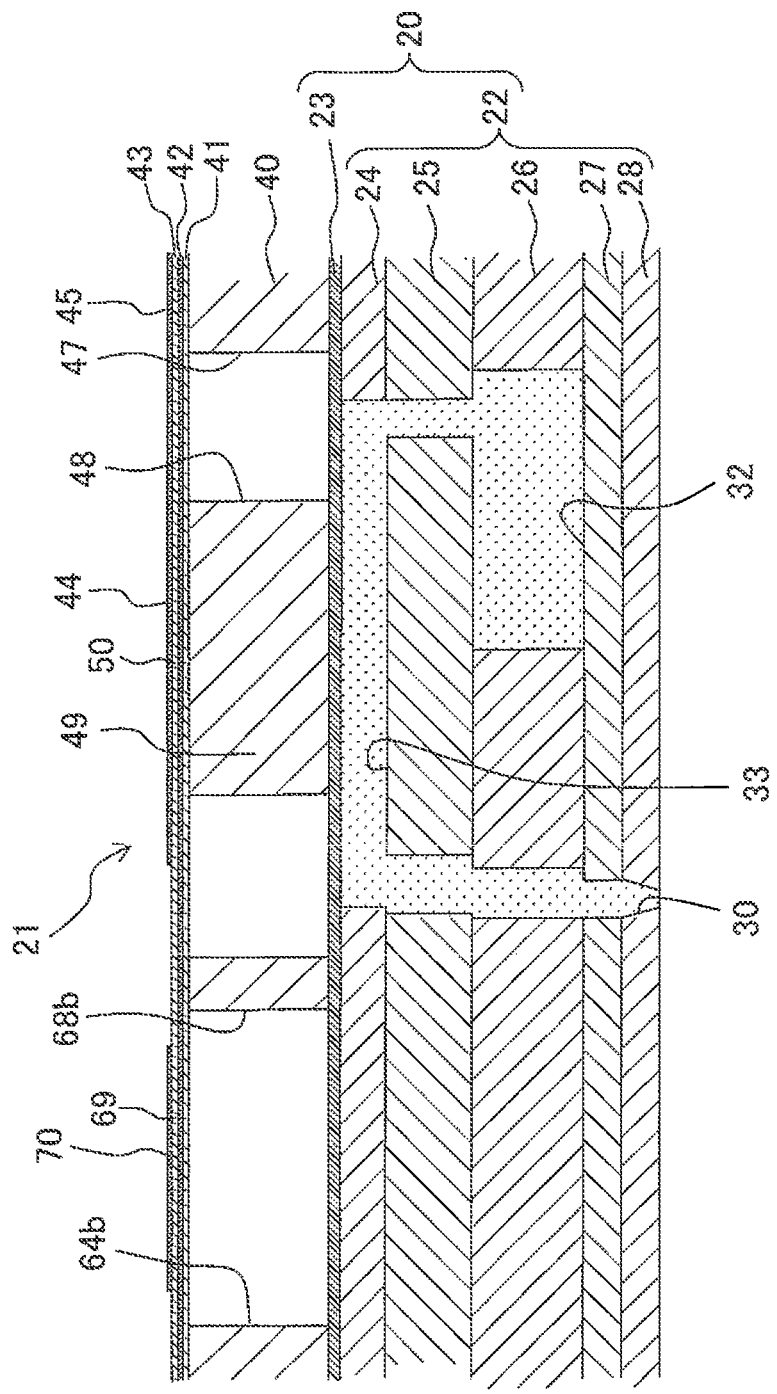
FIG. 18 shows a sectional view taken along a line XVIII-XVIII shown in FIG. 17.

A pressurizing piezoelectric element, which pressurizes the ink contained in the communication flow passage 64, may be provided for the actuator substrate 40. As shown in FIGS. 17 and 18, in the eighth modified embodiment, three flow passage holes 68a, 68b, 68c each having an identical width and flow passage holes 68d, 68e each having a narrow width for connecting the three flow passage holes 68a, 68b, 68c, which are aligned in an order from the upstream side in the transport direction, are formed for the actuator substrate 40. Communication flow passages 64a to 64e are formed by the spaces in the flow passage holes 68a to 68e. The flow passage in the flow passage hole 64b is especially referred to as "pressurizing chamber 64b" as well.

The flow passage hole 68e, which is positioned on the side of connection to the manifold 32 in relation to the flow passage hole 68b (pressurizing chamber 64b), has the narrow width and the long length as compared with the flow passage hole 68d which is positioned on the side of connection to the ink cartridge 17. In other words, the communication flow passage 64e, which is disposed on the side of the manifold 32 and which is connected to the pressurizing chamber 64b, has the flow passage resistance larger than that of the communication flow passage 64d which is disposed on the side of the ink cartridge.

As shown in FIG. 18, at least the flow passage hole 68b, which forms the pressurizing chamber 64b and which is included in the flow passage holes 68a to 68e, is the hole which arrives at the vibration layer 41 from the lower surface of the actuator substrate 40. A pressurizing electrode 70, which has the shape one size smaller than the flow passage hole 68b as viewed in a plan view, is arranged at the portion of the piezoelectric layer 43 to cover the flow passage hole 68b. The portion of the piezoelectric layer 43, which is interposed by the pressurizing electrode 70 and the common electrode 42, constitutes a pressurizing piezoelectric element 69. When the vibration layer 41 is deformed at the pressurizing chamber 64b by the pressurizing piezoelectric element 69, the ink contained in the pressurizing chamber 64b is thereby fed under pressure to the communication flow passage 64a disposed on the side of connection to the ink cartridge 17. Accordingly, the ink contained in the manifold 32 can be returned to the ink cartridge 17 via the communication flow passages 64a to 64e. The ink can be circulated between the manifold 32 and the ink cartridge 17. It is preferable to provide a check valve between the ink cartridge 17 and the communication hole 65 of the actuator substrate 40 in order to prevent the ink from being allowed to inflow from the ink cartridge 17 in an opposite manner. In the eighth modified embodiment, it is unnecessary to distinctly provide any pressurizing apparatus for circulating the ink.

Even in the case of a recessed flow passage hole in which the flow passage hole 68h for forming the pressurizing chamber 64b does not arrive at the vibration layer 41, it is possible to deform the vibration layer 41 by means of the pressurizing piezoelectric element 69. However, in order to greatly deform the vibration layer 41, as shown in FIG. 18, it is preferable to adopt such an arrangement that the pressurizing chamber 64b is formed by the flow passage hole 68b which arrives at the vibration layer 41, and the ink contained in the pressurizing chamber 64b is brought in contact with the vibration layer 41.

The communication flow passage 64, which is formed for the actuator substrate 40, is not limited to the flow passage which is provided to circulate the ink as described above. For example, it is also allowable to provide a flow passage which communicates the two manifolds 32 with each other. Alternatively, it is also allowable to provide a part of the flow passage for supplying the ink supplied from the ink cartridge 17 to the plurality of pressure chambers 33. For example, it is also allowable to provide a manifold which is communicated with the plurality of pressure chambers 33 respectively. That is, the manifold, which is provided for the flow passage unit 20 in the embodiment described above, may be formed for the actuator substrate 40.

Alternatively, it is also allowable to provide a flow passage through which any liquid other than the ink flows. For example, if the heat, which is generated from the driver IC 53 for driving the plurality of piezoelectric elements 50, is transmitted to the flow passage unit 20, then the temperature of the ink contained in the flow passage unit 20 is locally raised, and the viscosity of the ink is lowered at the concerning portion. In order to suppress the dispersion of the ink viscosity, it is also appropriate that a flow passage, which is provided for allowing a cooling liquid to flow in order to cool the flow passage unit 20, is formed for the actuator substrate 40.

Further, the position of the communication flow passage 64 in the actuator substrate 40 is not limited to the position disposed between the arrays of the accommodating chambers 58 arranged in the two arrays. That is, the position of the communication flow passage 64 can be freely set within the area in which the columnar portion 49 is not formed.

Ninth Modified Embodiment

Figure 19:
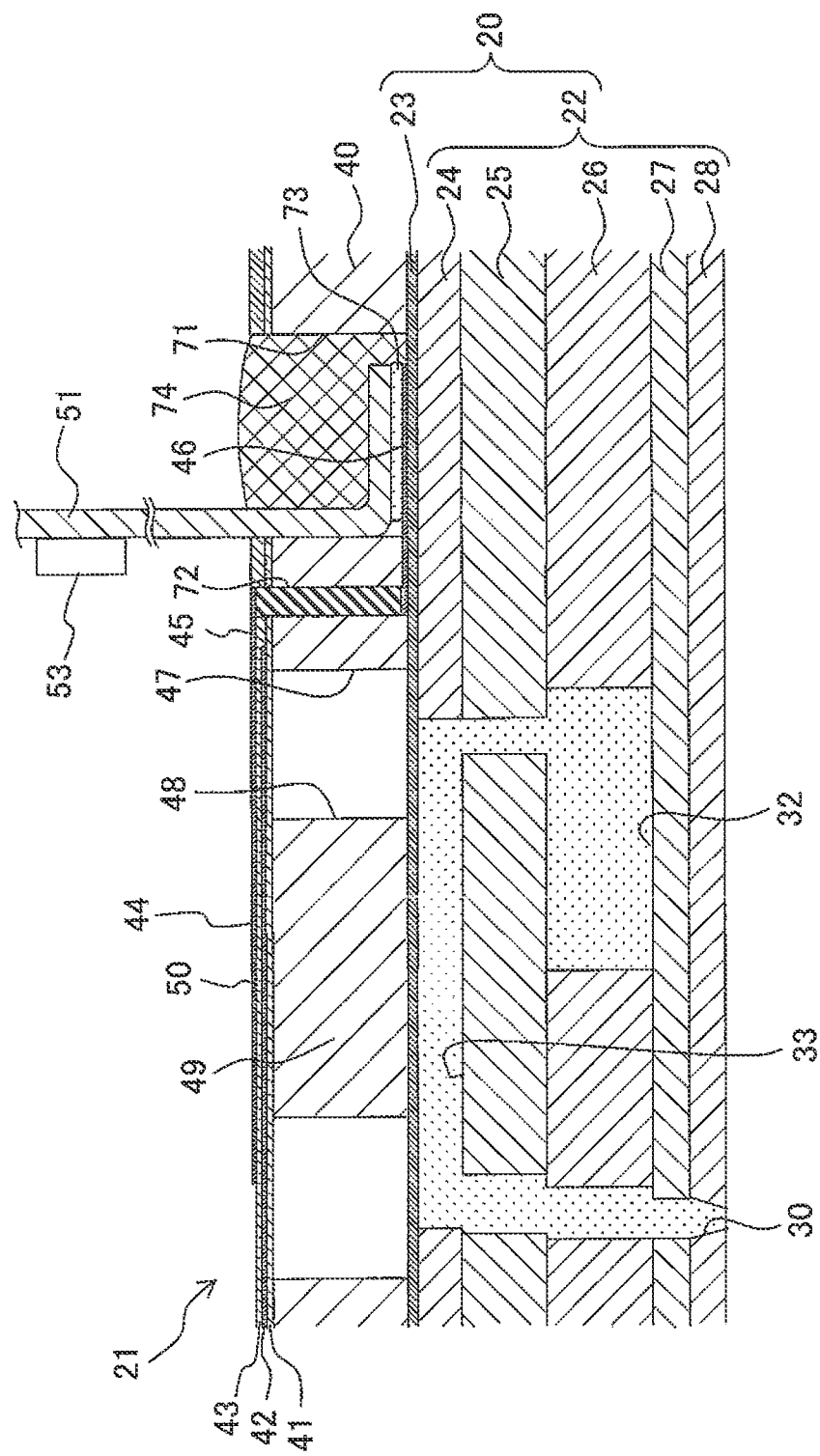
FIG. 19 shows a sectional view corresponding to FIG. 6 illustrating a ninth modified embodiment.

With reference to FIG. 19, a through-hole 71, which exposes a part of the ink sealing layer 23, is formed for the actuator substrate 40. The through-hole 71 is formed, for example, by means of the machining in a step to be performed before or after the etching step of etching the actuator substrate 40. A plurality of connecting terminals 46 are arranged at the part of the ink sealing layer 23 exposed by the through-hole 71. The plurality of connecting terminals 46 are connected to the plurality of individual electrodes 44 respectively by the aid of a conductive material in the through-hole 72 formed for the actuator substrate 40. When the ink sealing layer 23 is formed of a material having the conductivity such as a metal material or the like, then an insulating film is formed to cover the surface of the ink sealing layer 23, and then the plurality of connecting terminals 46 are arranged on the insulating film.

A forward end portion of COF 51 is inserted into the through-hole 71. The forward end portion of COF 51 is joined to the plurality of connecting terminals 46 arranged on the ink sealing layer 23 by means of, for example, an anisotropic conductive adhesive (film) (ACF) 73. Further, in order to reinforce the joining between COF 51 and the plurality of connecting terminals 46, the interior of the through-hole 71 is filled with a joining reinforcing material 74 which is composed of a synthetic resin material. The interior of the through-hole 71 is filled with the joining reinforcing material 74, and thus the joining reinforcing material 74 is prevented from flowing out. The fact that the actuator substrate 40 has a certain degree of thickness means that the volume of the through-hole 71 is also not less than a certain value. Therefore, the through-hole 71 can be filled with a sufficient amount of the joining reinforcing material 74, and it is possible to enhance the joining reliability between COF 51 and the connecting terminal 46.

The columnar portion 49 of the actuator substrate 40 transmits the deformation generated in the vibration layer 41 to the ink sealing layer 23. However, if the shape and/or the position of the columnar portion 49 is/are changed, then the amount to press the ink sealing layer 23 and/or the range to press the ink sealing layer 23 is/are changed, and hence the deformation amount of the ink sealing layer 23 is changed as well. In consideration of this viewpoint, it is also possible to adjust the deformation amount of the ink sealing layer 23 by actively changing the shape and/or the position of the columnar portion 49.

Tenth Modified Embodiments

The foregoing viewpoint will be explained as exemplified by an example. Such a situation is assumed that the individual electrode 44 is formed at any position deviated from the position at which the individual electrode 44 is to be originally formed in the step of forming the individual electrode 44 on the piezoelectric layer 43 (electrode forming step) when the piezoelectric element shown in FIG. 8B is formed in the embodiment described above. For example, when the individual electrodes 44 are formed by means of a method in which the accuracy is relatively low, including, for example, the screen printing, if the individual electrode 44 is formed at any position deviated from the original position, then the deformation amount of the vibration layer 41 is changed. Consequently, the deformation amount of the ink sealing layer 23, which closely relates to the pressure to be applied to the ink, is also deviated from the required amount.

In view of the above, the position of the individual electrode 44 thrilled in the electrode forming step is detected with respect to the piezoelectric element 50 (pressure chamber 33). The shape and the formation position of the columnar portion 49 are determined in the etching step shown in FIG. 8C depending on the detected position. That is, if the position of the individual electrode 44 is deviated from the predetermined position at which the individual electrode 44 is to be originally formed, the deformation amount of the ink sealing layer 23 is adjusted by changing the shape or the formation position of the columnar portion 49 depending on the deviation amount. The positional deviation amount of the individual electrode 44 is detected, thr example, as follows. In the case of the screen printing, the screen for printing is elongated as a whole, and thus the positional deviation arises in the plurality of individual electrodes 44 respectively. In order to grasp the positional deviation of the individual electrode 44 caused by the elongation of the screen, it is appropriate that the distance, which is provided between the two individual electrodes 44 separated by the longest distance of the plurality of individual electrodes 44, is measured by using a measuring machine, and the distance is compared with a designed value. Further, in order to change the shape and/or the formation position of the columnar portion 49 in the etching step, for example, it is appropriate that the pattern of the mask film to be formed on the lower surface of the actuator substrate 40 is changed.

In the example described above, the positional deviation of the individual electrode 44 has been described. However, other than the above, the adjustment can be also performed in the same manner as described above in relation to the deviation of the characteristic of the piezoelectric element 50 caused by the deviation of the film thickness of the piezoelectric layer 43, the electrode or the like from a predetermined value. For example, if the thickness of the piezoelectric layer 43 is deviated from a required value, and the capacitance of the piezoelectric element 50 is deviated from a predetermined value, then the deformation amount of the ink sealing layer 23 can be adjusted by changing the shape and/or the formation position of the columnar portion 49.

In FIG. 8A of the embodiment described above, the vibration layer 41, which is composed of silicon oxide or silicon nitride, is formed by applying the oxidation treatment or the nitriding treatment to the actuator substrate. However, the step of forming the vibration layer 41 is not limited thereto. For example, a vibration layer 41, which is composed of a material having the resistance to the etching solution (for example, ceramics material such as zirconia, alumina or the like), may be formed as a film by means of, for example, the sputtering method on the actuator substrate 40 composed of silicon.

The flow passage unit 20 of the embodiment described above has such a structure that the plurality of plates, each of which is formed of the metal material or the resin material, are stacked. However, the structure and the material of the flow passage unit are not limited to those of the embodiment described above. It is also allowable to use a flow passage unit in which a part of the flow passage unit or all of the flow passage unit is formed of silicon. For example, it is also appropriate to use flow passage unit having a two-layer structure of a flow passage forming substrate which is formed of silicon or the like and a nozzle plate which is formed of silicon or the like.

In the embodiment and the modified embodiments thereof explained above, the present invention is applied to the inkjet head for discharging the ink onto the recording paper. However, the present invention is also applicable to any liquid discharge apparatus for another way of use. For example, the present invention can be also applied to a liquid discharge apparatus in which a conductive liquid is discharged to a substrate to form a conductive pattern on a substrate surface. The objective of application of the present invention is not limited to the piezoelectric actuator of the liquid discharge apparatus. For example, the present invention can be also applied to any actuator to be used for any way of use other than the liquid discharge, including, for example, a pump for feeding a liquid under pressure to be provided for a minute flow passage.

What is claimed is:

1. A liquid discharge apparatus comprising:
   a flow passage structure in which a liquid flow passage including a nozzle for discharging a liquid and a pressure chamber communicated with the nozzle, and a liquid sealing layer for covering the pressure chamber are formed; and
   a piezoelectric actuator which is arranged to contact with the liquid sealing layer of the flow passage structure,
   wherein the piezoelectric actuator has:
      an actuator substrate which is arranged on a surface of the liquid sealing layer on a side opposite to the pressure chamber, the actuator substrate having a vibration layer which is provided on a side of the actuator substrate opposite to the liquid sealing layer and which is opposed to the liquid sealing layer, and a columnar portion which is arranged to be opposed to the pressure chamber between the liquid sealing layer and the vibration layer and which is connected to the vibration layer; and
      a piezoelectric portion which is formed as a film on a surface of the vibration layer on a side opposite to the columnar portion.

2. The liquid discharge apparatus according to claim 1, further comprising a film member which is stacked on an area of the liquid sealing layer to cover the pressure chamber, wherein when viewed from a stacking direction, an areal size of the film member is smaller than an areal size of the pressure chamber and greater than an areal size of an end surface of the columnar portion on a side of the liquid sealing layer.

3. The liquid discharge apparatus according to claim 2, wherein a rigidity of the film member is greater than a rigidity of the liquid sealing layer.

4. The liquid discharge apparatus according to claim 1, wherein an areal size of an end surface of the columnar portion on a side of the liquid sealing layer is smaller than an areal size of an end surface of the columnar portion on a side of the vibration layer.

5. The liquid discharge apparatus according to claim 1, further comprising a liquid storage unit which stores the liquid,
wherein a communication flow passage, which is communicated with the liquid storage unit and the liquid flow passage of the flow passage structure respectively and which is provided to move the liquid between the liquid flow passage and the liquid storage unit, is formed in the actuator substrate at a portion different from the columnar portion.

6. The liquid discharge apparatus according to claim 5,
wherein a recessed flow passage hole, which is open on a flow passage structure side of the actuator substrate and which does not arrive at the vibration layer, is provided for the actuator substrate, and
a space in the flow passage hole is the communication flow passage.

7. The liquid discharge apparatus according to claim 5, wherein a pressurizing piezoelectric element, which is provided to pressurize the liquid in the communication flow passage, is arranged on the vibration layer at a portion covering the communication flow passage.

8. The liquid discharge apparatus according to claim 1, further comprising a flexible wiring board which is connected to the piezoelectric portion,
wherein a through-hole, through which a part of the liquid sealing layer is exposed, is formed in the actuator substrate,
a connecting terminal, which is connected to the piezoelectric portion, is arranged at the part of the liquid sealing layer which is exposed through the through-hole,
a part of the flexible wiring board is inserted into the through-hole and joined to the connecting terminal, and
the through-hole, into which the flexible wiring board is inserted, is filled with a joining reinforcing material.

9. The liquid discharge apparatus according to claim 1, wherein the piezoelectric portion has a thickness of 0.5 to 2.0 μm.

10. A piezoelectric actuator comprising:
an actuator substrate which has a vibration layer and a columnar portion connected to the vibration layer; and
a piezoelectric portion which is arranged on a surface of the vibration layer on a side opposite to the columnar portion.

11. A method for producing the liquid discharge apparatus as defined in claim 1, comprising:
a flow passage structure producing step for producing the flow passage structure;
an actuator producing step for producing the piezoelectric actuator; and
a joining step for joining the flow passage structure and the piezoelectric actuator,
wherein the actuator producing step comprises:
a piezoelectric portion forming step for forming the piezoelectric portion as a film on a surface of the vibration layer of the actuator substrate; and
an etching step for forming, in the actuator substrate, the columnar portion and a recessed hole surrounding the columnar portion by performing etching from a surface of the actuator substrate on a side opposite to the vibration layer.

12. The method for producing the liquid discharge apparatus according to claim 11,
wherein the actuator producing step further comprises an electrode forming step for forming an electrode on the piezoelectric portion, and
a shape and a formation position of the columnar portion are determined in the etching step depending on a position of the electrode, which is formed in the electrode forming step, with respect to the piezoelectric portion.

13. The liquid discharge apparatus according to claim 1, wherein the actuator substrate is formed of single crystal silicon.

14. The liquid discharge apparatus according to claim 13, wherein the vibration layer is formed by applying one of an oxidation treatment and a nitriding treatment to a surface of the actuator substrate on the side opposite to the liquid sealing layer.

15. The liquid discharge apparatus according to claim 14, wherein the columnar portion is formed by performing etching for the actuator substrate from a side opposite to the vibration layer.

16. The liquid discharge apparatus according to claim 15, wherein the columnar portion is formed by the etching for the actuator substrate after forming the piezoelectric portion by film formation on the vibration layer.

17. The liquid discharge apparatus according to claim 14, wherein the piezoelectric portion is formed on the vibration layer without adhesive between the piezoelectric portion and the vibration layer.

18. The liquid discharge apparatus according to claim 1, wherein the piezoelectric actuator is joined to the liquid sealing layer of the flow passage structure without polishing a surface of the actuator substrate opposed to the liquid sealing layer.

* * * * *